US010623019B2

(12) United States Patent
Lee et al.

(10) Patent No.: US 10,623,019 B2
(45) Date of Patent: Apr. 14, 2020

(54) METHOD OF DECODING LOW DENSITY PARITY CHECK (LDPC) CODE, DECODER AND SYSTEM PERFORMING THE SAME

(71) Applicant: SAMSUNG ELECTRONICS CO., LTD., Suwon-si (KR)

(72) Inventors: Myung-Kyu Lee, Seoul (KR); Jae-Hong Kim, Seoul (KR); Ki-Jun Lee, Seoul (KR); Jun-Jin Kong, Yongin-si (KR); Hong-Rak Son, Anyang-si (KR); Se-Jin Lim, Seoul (KR); Young-Jun Hwang, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 14 days.

(21) Appl. No.: 16/024,017

(22) Filed: Jun. 29, 2018

(65) Prior Publication Data
US 2019/0158116 A1    May 23, 2019

(30) Foreign Application Priority Data

Nov. 22, 2017  (KR) .................... 10-2017-0156549

(51) Int. Cl.
*H03M 13/11* (2006.01)
*G06F 11/10* (2006.01)
(Continued)

(52) U.S. Cl.
CPC ..... *H03M 13/1128* (2013.01); *G06F 11/1012* (2013.01); *G06F 11/1068* (2013.01); *H03M 13/616* (2013.01); *G11C 29/52* (2013.01)

(58) Field of Classification Search
CPC ............ H03M 13/1128; H03M 13/616; G06F 11/1068; G11C 29/52
See application file for complete search history.

(56) References Cited

U.S. PATENT DOCUMENTS

| 6,848,069 B1 * | 1/2005 | Levy ................. H03M 13/2948 714/755 |
| 7,559,008 B1 * | 7/2009 | Patapoutian ....... H03M 13/1137 714/800 |

(Continued)

FOREIGN PATENT DOCUMENTS

KR    10-2015-0004732 A    1/2015

OTHER PUBLICATIONS

Zhongfeng Wang et al., "VLSI Design for Low-Density Parity-Check Code Decoding", IEEE Circuits and Systems Magazine, First Quarter 2011, Feb. 18, 2011, pp. 52-69. (18 pages total).

*Primary Examiner* — Kyle Vallecillo
(74) *Attorney, Agent, or Firm* — Sughrue Mion, PLLC

(57) ABSTRACT

A method of decoding a low density parity check (LDPC) code, includes dividing a parity check matrix of the LDPC code, into a plurality of sub blocks. The method further includes, for each of a plurality of decoding iterations, performing a node operation of each of target sub blocks among the plurality of sub blocks, the target sub blocks corresponding to a present decoding iteration among the plurality of decoding iterations, in a decoding schedule, estimating a reliability of each of the target sub blocks, based on a result of the node operation of each of the target sub blocks, and adjusting the decoding schedule, based on the reliability of each of the target sub blocks.

19 Claims, 25 Drawing Sheets

(51) Int. Cl.
*G11C 29/52* (2006.01)
*H03M 13/00* (2006.01)

(56) References Cited

U.S. PATENT DOCUMENTS

| | | | |
|---|---|---|---|
| 7,802,163 B2 | 9/2010 | Tan | |
| 8,413,029 B2 | 4/2013 | Rauschmayer et al. | |
| 8,549,375 B2 | 10/2013 | Ueng et al. | |
| 8,700,973 B1 | 4/2014 | Varnica et al. | |
| 9,112,530 B2 | 8/2015 | Gunnam et al. | |
| 9,160,369 B1 * | 10/2015 | Miladinovic | H03M 13/2942 |
| 2008/0052594 A1 | 2/2008 | Yedidia et al. | |
| 2010/0037121 A1 * | 2/2010 | Jin | H03M 13/1117 |
| | | | 714/763 |
| 2010/0098185 A1 * | 4/2010 | Miyazaki | H04B 7/0669 |
| | | | 375/267 |
| 2010/0223524 A1 * | 9/2010 | Duggan | H03M 13/3707 |
| | | | 714/751 |
| 2012/0185750 A1 * | 7/2012 | Hayami | H03M 13/1111 |
| | | | 714/758 |
| 2013/0111290 A1 * | 5/2013 | Zhang | H03M 13/1108 |
| | | | 714/752 |
| 2017/0322751 A1 | 11/2017 | Cohen et al. | |

\* cited by examiner

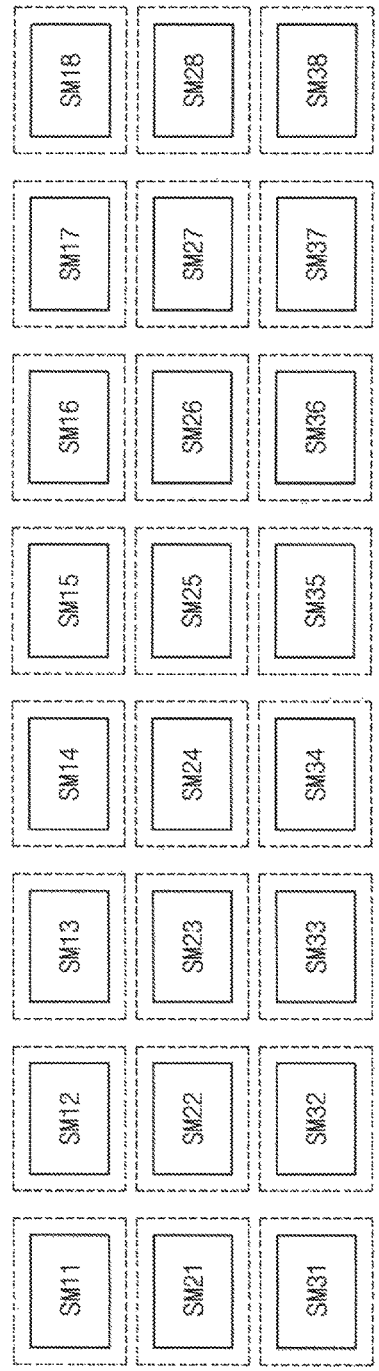

FIG. 5A $$S_{3\times5} = \begin{bmatrix} 2 & 3 & 110 & 142 & 165 \\ 5 & 64 & 96 & 113 & 144 \\ 7 & 50 & 75 & 116 & 174 \end{bmatrix}$$

SCHTB

| NSB | NITR |
|-----|------|
| 1   | K    |
| 2   | K+1  |
| 3   | K    |
| 4   | K+2  |
| 5   | K    |

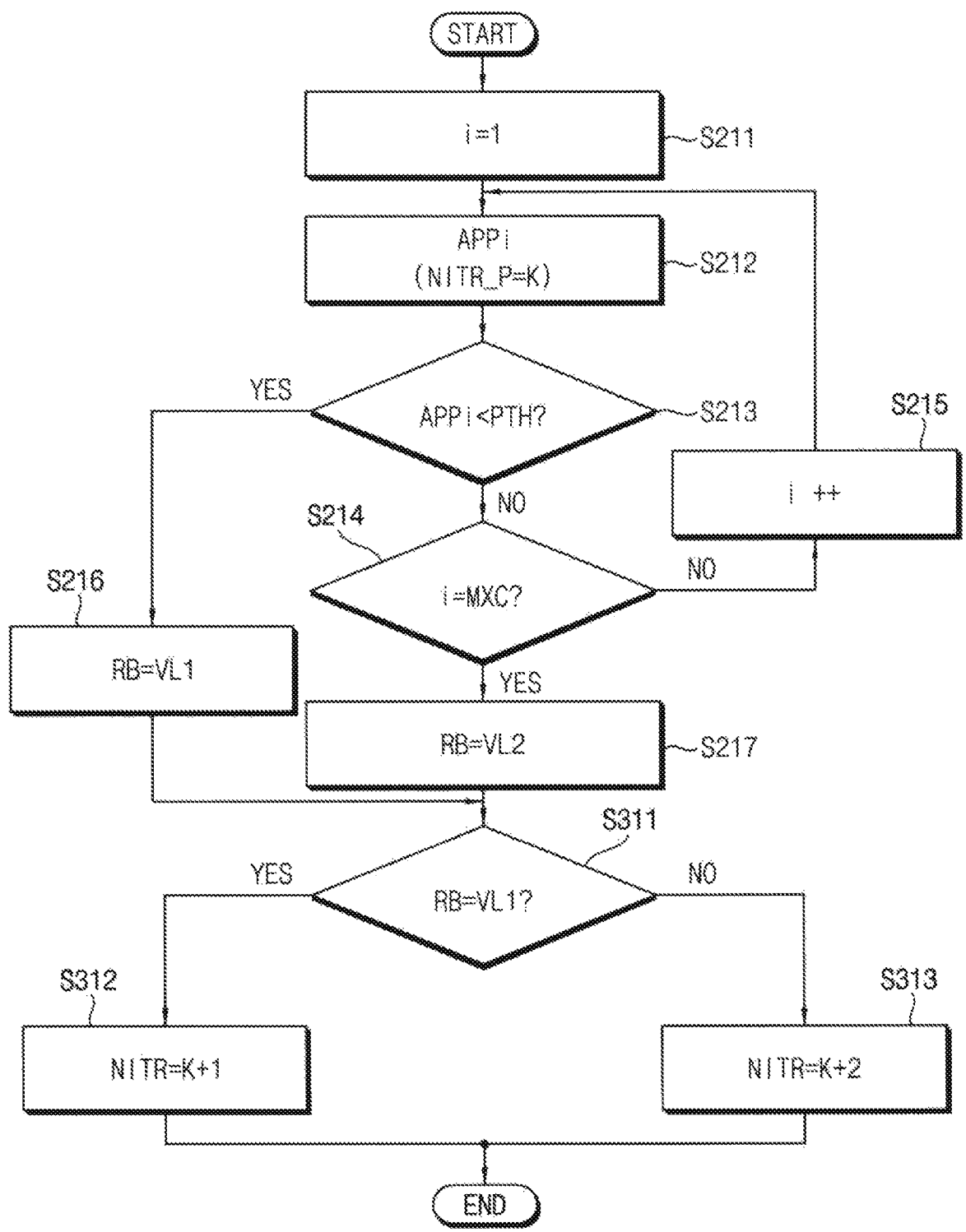

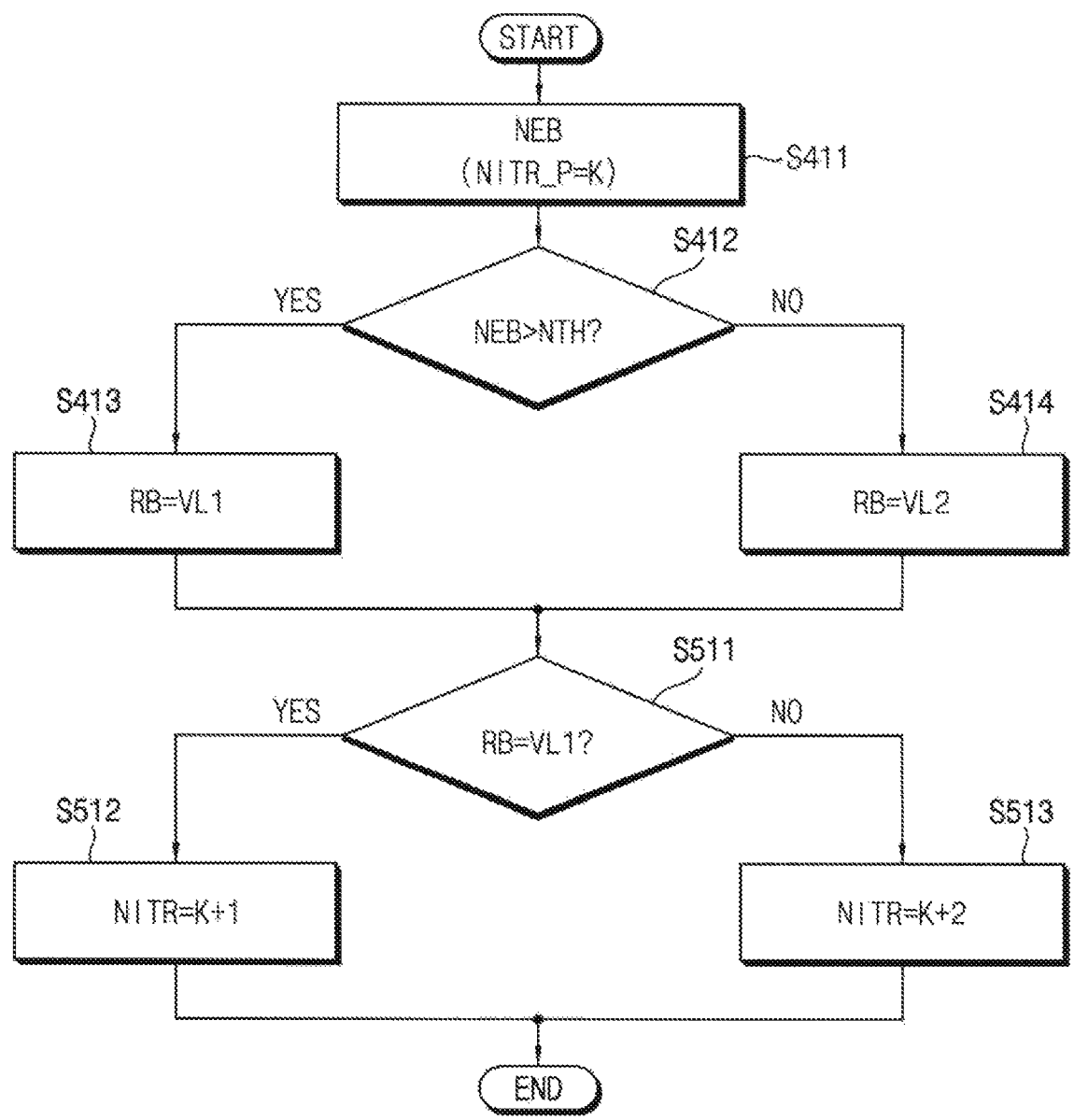

FIG. 9A

NITR_P=K  NSB=2

SCHTB(BEFORE)

| NSB | NITR |
|---|---|
| 1 | K+1 |
| 2 | (K) |
| 3 | K+1 |
| 4 | K |
| 5 | K+1 |

RB=VL2 ⇒

SCHTB(AFTER)

| NSB | NITR |
|---|---|
| 1 | K+1 |
| 2 | (K+2) |
| 3 | K+1 |
| 4 | K |
| 5 | K+1 |

FIG. 9B

NITR_P=K  NSB=4

SCHTB(BEFORE)

| NSB | NITR |
|---|---|
| 1 | K+1 |
| 2 | K+2 |
| 3 | K+1 |
| 4 | (K) |
| 5 | K+1 |

RB=V1 ⇒

SCHTB(AFTER)

| NSB | NITR |
|---|---|
| 1 | K+1 |
| 2 | K+2 |
| 3 | K+1 |
| 4 | (K+1) |
| 5 | K+1 |

FIG. 9C

NITR_P=K+1  NSB=1

SCHTB(BEFORE)

| NSB | NITR |
|---|---|
| 1 | (K+1) |
| 2 | K+2 |
| 3 | K+1 |
| 4 | K+1 |
| 5 | K+1 |

RB=VL2 ⇒

SCHTB(AFTER)

| NSB | NITR |
|---|---|
| 1 | (K+3) |
| 2 | K+2 |
| 3 | K+1 |
| 4 | K+1 |
| 5 | K+1 |

FIG. 9D

NITR_P=K+1  NSB=3

SCHTB(BEFORE)

| NSB | NITR |
|---|---|
| 1 | K+3 |
| 2 | K+2 |
| 3 | (K+1) |
| 4 | K+1 |
| 5 | K+1 |

RB=VL2 ⇒

SCHTB(AFTER)

| NSB | NITR |
|---|---|
| 1 | K+3 |
| 2 | K+2 |
| 3 | (K+3) |
| 4 | K+1 |
| 5 | K+1 |

FIG. 9E

NITR_P=K+1   NSB=4

SCHTB(BEFORE)

| NSB | NITR |
|---|---|
| 1 | K+3 |
| 2 | K+2 |
| 3 | K+3 |
| 4 | (K+1) |
| 5 | K+1 |

RB=VL1 ⇒

SCHTB(AFTER)

| NSB | NITR |
|---|---|
| 1 | K+3 |
| 2 | K+2 |
| 3 | K+3 |
| 4 | (K+2) |
| 5 | K+1 |

FIG. 9F

NITR_P=K+1   NSB=5

SCHTB(BEFORE)

| NSB | NITR |
|---|---|
| 1 | K+3 |
| 2 | K+2 |
| 3 | K+3 |
| 4 | K+2 |
| 5 | (K+1) |

RB=VL1 ⇒

SCHTB(AFTER)

| NSB | NITR |
|---|---|
| 1 | K+3 |
| 2 | K+2 |
| 3 | K+3 |
| 4 | K+2 |
| 5 | (K+2) |

NITR_P=K+1  NSB=3

SCHTB(BEFORE)

| NSB | NITR |
|---|---|
| 1 | K+2 |
| 2 | K+3 |
| 3 | (K+1) |
| 4 | K+2 |
| 5 | K+2 |

RB=VL3 ⇒

SCHTB(AFTER)

| NSB | NITR |
|---|---|
| 1 | K+2 |
| 2 | K+3 |
| 3 | (K+4) |
| 4 | K+2 |
| 5 | K+2 |

METHOD OF DECODING LOW DENSITY PARITY CHECK (LDPC) CODE, DECODER AND SYSTEM PERFORMING THE SAME

CROSS-REFERENCE TO RELATED APPLICATION

This application claims priority from Korean Patent Application No. 10-2017-0156549, filed on Nov. 22, 2017, in the Korean Intellectual Property Office (KIPO), the disclosure of which is incorporated herein by reference in its entirety.

BACKGROUND

1. Field

Methods and apparatuses consistent with example embodiments relate generally to semiconductor integrated circuits, and more particularly to a method of decoding low density parity check (LDPC) code, a decoder and a system performing the method.

2. Discussion of Related Art

Error correction code (ECC) or error check and correction is an essential factor in digital communication and a data storage system for robust information transfer. A low density parity check (LDPC) is among most promising near-Shannon limit error correction codes, and it has been considered in many industrial standards such as WLAN (802.11n), WiMAX (802.16e), DVB-S2, CMMB, 10GBaseT (802.3an), a memory system, etc. The LDPC code is usually decoded with iterative processing loops to obtain optimal decoding performance with moderate complexity. Such iterative processing loops are referred to as decoding iterations. As the number of the decoding iterations is increased, decoding throughput is decreased and decoding latency is increased. A large number of calculators may be included in an LDPC decoder to achieve a high decoding data rate, which leads to large chip area and high power consumption. Low power chip implementation of the LDPC decoder has become critical with the ever increasing demand of wireless and portable computing devices as well as the rising desire to reduce packaging costs.

SUMMARY

According to example embodiments, a method of decoding a low density parity check (LDPC) code, includes dividing a parity check matrix of the LDPC code, into a plurality of sub blocks. The method further includes, for each of a plurality of decoding iterations, performing a node operation of each of target sub blocks among the plurality of sub blocks, the target sub blocks corresponding to a present decoding iteration among the plurality of decoding iterations, in a decoding schedule, estimating a reliability of each of the target sub blocks, based on a result of the node operation of each of the target sub blocks, and adjusting the decoding schedule, based on the reliability of each of the target sub blocks.

According to example embodiments, a low density parity check (LDPC) decoder that divides a parity check matrix of an LDPC code, into a plurality of sub blocks and performs a decoding operation for each of a plurality of decoding iterations, includes a variable node processor and a check node processor configured to perform a node operation of each of target sub blocks among the plurality of sub blocks, the target sub blocks corresponding to a present decoding iteration among the plurality of decoding iterations, in a decoding schedule. The LDPC decoder further includes a reliability estimator configured to estimate a reliability of each of the target sub blocks, based on a result of the node operation of each of the target sub blocks, and an update manager configured to adjust the decoding schedule, based on the reliability of each of the target sub blocks.

According to example embodiments, a memory system includes a memory device including a plurality of memory cells, a memory controller configured to control an operation of the memory device, and a low density parity check (LDPC) decoder configured to divide a parity check matrix of an LDPC code that is read from the memory cells, into a plurality of sub blocks, and perform a decoding operation for each of a plurality of decoding iterations. The LDPC decoder includes a variable node processor and a check node processor configured to perform a node operation of each of target sub blocks among the plurality of sub blocks, the target sub blocks corresponding to a present decoding iteration among the plurality of decoding iterations, in a decoding schedule. The LDPC decoder further includes a reliability estimator configured to estimate a reliability of each of the target sub blocks, based on a result of the node operation of each of the target sub blocks, and an update manager configured to adjust the decoding schedule, based on the reliability of each of the target sub blocks.

BRIEF DESCRIPTION OF THE DRAWINGS

FIGS. 4A, 4B, 4C, 4D and 4E are diagrams illustrating methods of dividing a PCM according to example embodiments.

FIGS. 5A and 5B are diagrams for describing a scheduling table for LDPC code decoding.

FIG. 7 is a flow chart illustrating a method of reliability estimation and decoding schedule adjustment according to example embodiments.

FIG. 8 is a flow chart illustrating a method of reliability estimation and decoding schedule adjustment according to example embodiments.

FIGS. 9A, 9B, 9C, 9D, 9E and 9F are diagrams illustrating an example sequence of updating a scheduling table by the methods of FIGS. 7 and 8.

FIGS. 15A and 15B are diagrams for describing reduction of a decoding time according to example embodiments.

DETAILED DESCRIPTION OF EXAMPLE EMBODIMENTS

Example embodiments may provide a method of decoding an LDPC code for efficient error check and correction.

Example embodiments may provide an LDPC decoder for efficient error check and correction.

Example embodiments may provide a memory system including an LDPC decoder for efficient error check and correction.

The method of decoding an LDPC code, the LDPC decoder and the memory system including the LDPC decoder according to example embodiments may reduce a decoding time and power consumption by adaptively adjusting the decoding schedule based on the result of the node operation.

Figure 1:
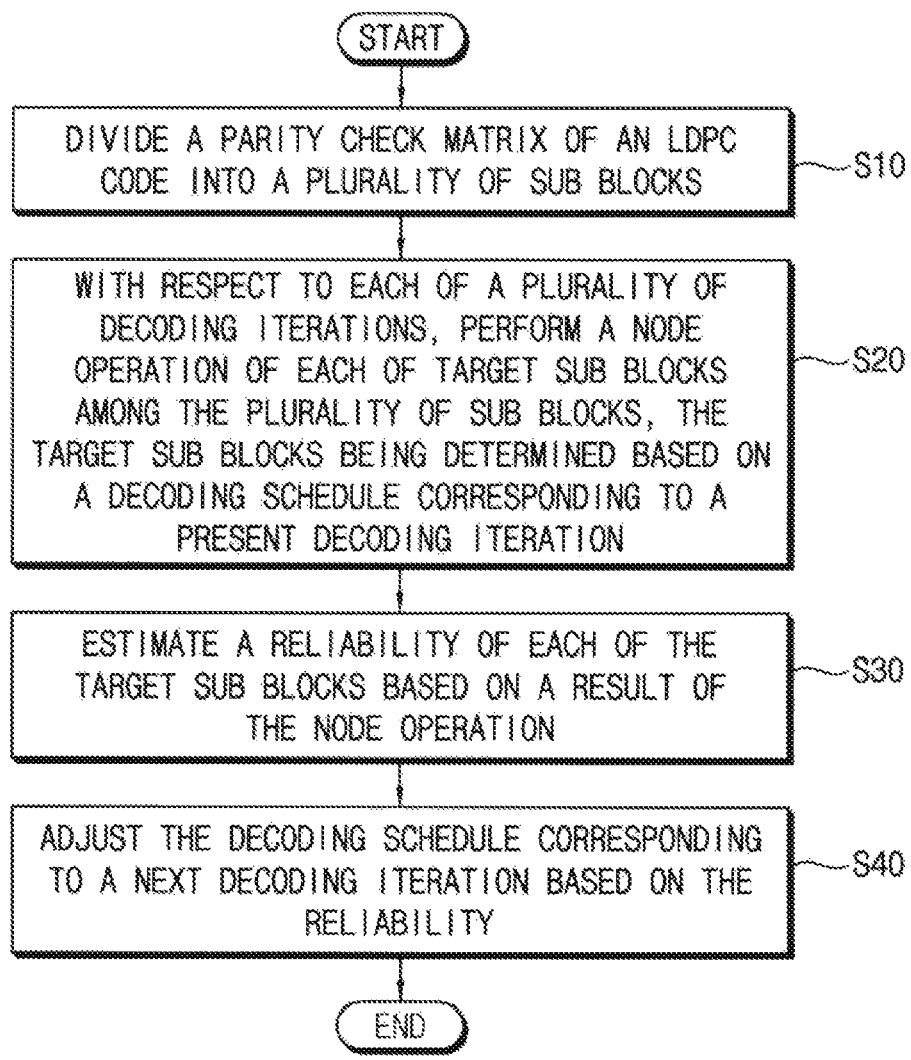
FIG. 1 is a flow chart illustrating a method of a low density parity check (LDPC) code according to example embodiments.

FIG. 1 is a flow chart illustrating a method of a low density parity check (LDPC) code according to example embodiments.

Referring to FIG. 1, a parity check matrix of an LDPC code is divided into a plurality of sub blocks (S10). The parity check matrix and the division of the parity check matrix will be described below with reference to FIGS. 3A through 4E.

With respect to each of a plurality of decoding iterations, a node operation of each of target sub blocks among the plurality of sub blocks is performed, where the target sub blocks are determined based on a decoding schedule corresponding to a present decoding iteration (S20). An LDPC decoding message may be represented by a log likelihood ratio (LLR) and the decoding message is changed by the node operation. Thus the LDPC decoding operation or the node operation may be referred to as an update operation. The node operation may be performed by various schemes that are well known to those skilled in the art.

A reliability of each of the target sub blocks is estimated based on a result of the node operation (S30). In some example embodiments, as will be described below with reference to FIG. 7, the reliability of the target sub block may be estimated using an LLR of a decoding message of the target sub block. In other example embodiments, as will be described below with reference to FIG. 8, the reliability of the target sub block may be estimated using an error bit number of the target sub block as the result of the node operation.

The decoding schedule corresponding to a next decoding iteration is adjusted based on the reliability (S40). According to example embodiments, the adjustment of the decoding schedule may be performed such that, when the reliability of the target sub block is estimated to be higher than a reference reliability in the present decoding iteration, the node operation of the target sub block is omitted in the next decoding operation.

Through the repeated decoding iterations during the LDPC decoding process, the values received from a channel converge on a codeword. The error bit number is decreased gradually as the decoding iteration is repeated, and a sub block having no bit error may occur according as the repetition of the decoding iteration progresses. Updating the sub block having no bit error or the small number of bit errors does not influence on improvement of the decoding result, which leads to increase in a decoding time and power consumption.

The method of decoding an LDPC code, the LDPC decoder and the memory system including the LDPC decoder according to example embodiments may reduce a decoding time and power consumption by adaptively adjusting the decoding schedule based on the result of the node operation.

Figure 2:
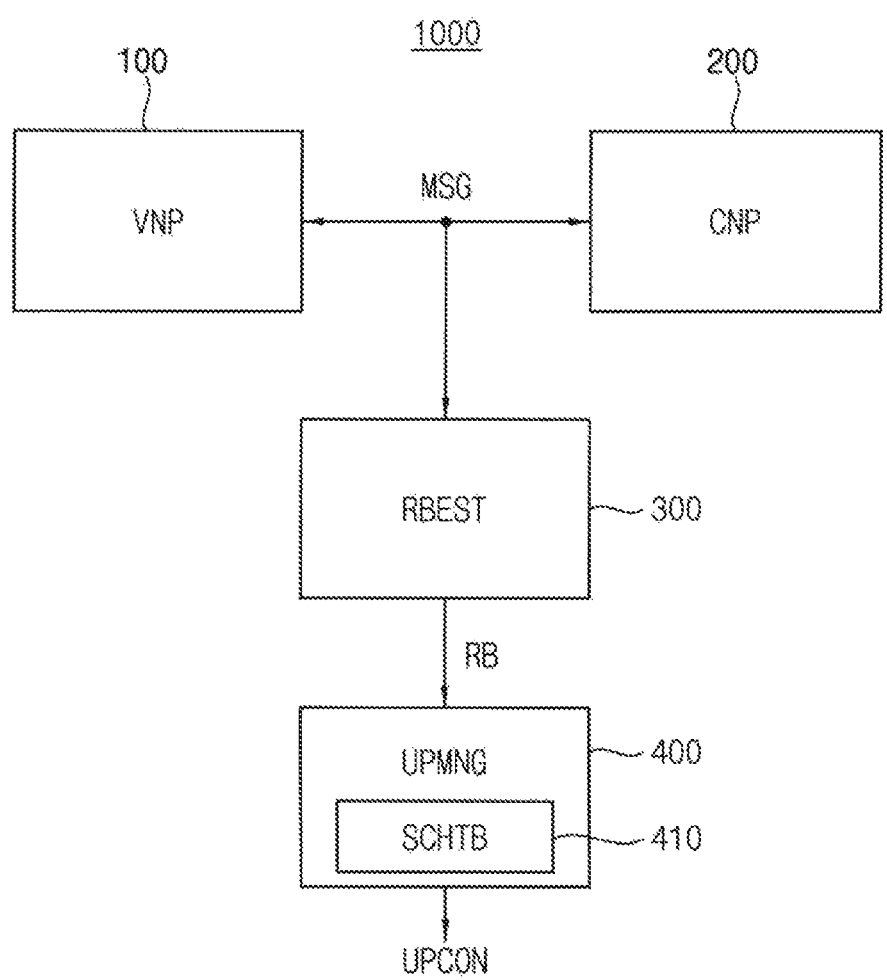
FIG. 2 is a block diagram illustrating an LDPC decoder according to example embodiments.

FIG. 2 is a block diagram illustrating an LDPC decoder according to example embodiments.

Referring to FIG. 2, an LDPC decoder 1000 may include a variable node processor 100 (VNP), a check node processor 200 (CNP), a reliability estimator 300 (RBEST) and an update manager 400 (UDMNG).

The LDPC decoder 1000 divides a parity check matrix of an LDPC code into a plurality of sub blocks and performs a decoding operation repeatedly with respect to a plurality of decoding iterations.

The variable node processor 100 and the check node processor 200 perform a node operation of each of target sub blocks among the plurality of sub blocks. The target sub blocks are determined based on a decoding schedule corresponding to a present decoding iteration. The reliability estimator 300 estimates a reliability of each of the target sub blocks based on a result of the node operation. The update manager 400 adjusts the decoding schedule corresponding to a next decoding iteration based on the reliability.

The reliability estimator 300 may compare the result of the node operation with at least one reference value and generate a reliability signal RB having a value of the reliability based on a result of the comparison. The result of the node operation may be obtained based on a message MSG transferred between the processors 100 and 200. The update manager 400 may adjust the decoding schedule based on the reliability signal RB. In some example embodiments, the reliability signal RB may have one of a first value VL1 and a second value VL2. In this case, the first value VL1 may represent that the reliability is relatively high and the second value VL2 may represent that the reliability is relatively low. In other example embodiments, the reliability signal RB may have one of three or more values, for example, one of a first value VL1, a second value VL2 and a third value VL3. In this case, the reliability may be divided into three or more ranges using the three or more values of the reliability signal RB.

In some example embodiments, the update manager 400 may include a scheduling table SCHTB 410. The scheduling table 410 may represent a mapping relation between each sub block and a corresponding decoding iteration in which the node operation of each sub block is performed. The update manager 400 may update the mapping relation of the scheduling table 310 for subsequent decoding iterations based on the reliability. The update manager 400 may generate a control signal UPCON to control the node operation of the processors 100 and 200 referring to the mapping relation of the scheduling table.

The reliability estimator 300 and the update manager 400 may be implemented as hardware, software or a combination of hardware and software. At least a portion of the reliability estimator 300 and the update manager 400 may be implemented as a computer program product embodied in one or more computer readable mediums having computer readable program code embodied thereon.

Figures 3A, 3B:
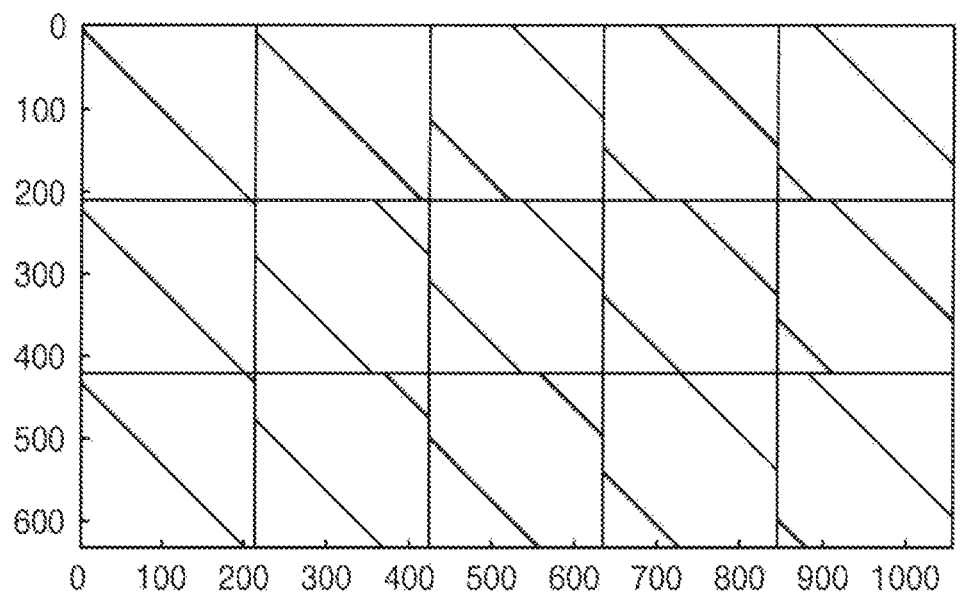
FIGS. 3A, 3B and 3C are diagrams for describing a parity check matrix (PCM) for LDPC code decoding.
Figure 3C:
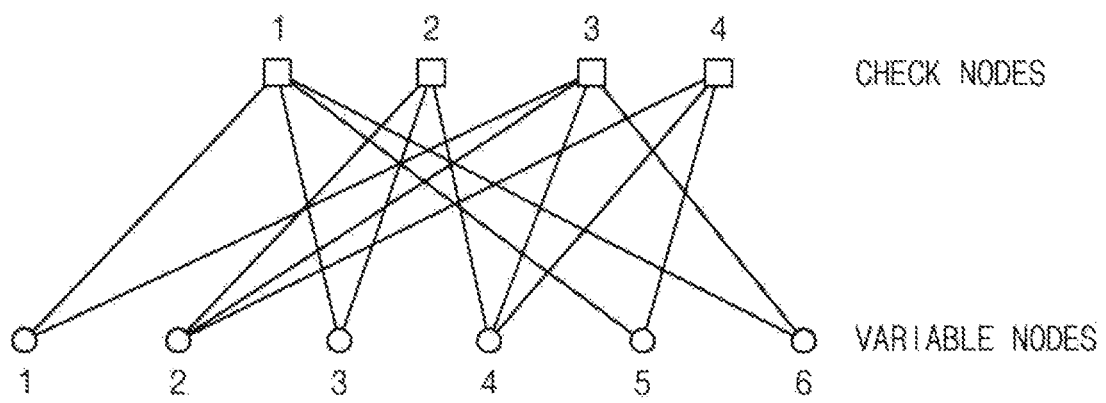

FIGS. 3A, 3B and 3C are diagrams for describing a parity check matrix (PCM) for LDPC code decoding.

An LDPC code has an error correction capability near a channel capacity and is widely used in communication systems, communication standards, memory controllers, etc. The LDPC code is a linear block code that may be defined as a parity check matrix (PCM). Here, the definition of a code may be a relation between information and parity.

The LDPC code having a codeword length of n and an information length of k may be represented by the PCM having a size of (n−k)*n. The LDPC code has a higher correction capability as the codeword length is long. For example, the memory controller may use a codeword longer than 1 KB. The size of the PCM of the long codeword is very large and it is difficult to store the PCM of the big size.

To solve such problems, the PCM may be divided into a plurality of sub blocks and the PCM may be defined by information of each sub matrix, for example, a position of each sub matrix, a shape of each sub matrix, etc. The LDPC code defined as such may be referred to as a quasi-cyclic LDPC (QC-LDPC) code. For example, it is assumed that the codeword length is 1055 bits and the information length is 422 (=1055−633). If the size of the sub matrix is 211, the five sub matrices may be arranged in each row (1055/211=5) and the three sub matrices may be arranged in each column (633/211=3) as illustrated in FIG. 3A. Each sub matrix may be obtained by a circular shifting of an identity matrix. The PCM may be simplified to a 3*5 matrix as illustrated in FIG. 3B using shifter numbers of the sub matrices. In other words, the PCM may be represented simply in comparison with the representation of 633*1055 matrix. The QC-LDPC code may be efficiently applied to various systems.

FIG. 3C shows an example of a Tanner graph. The Tanner graph includes variable nodes, check nodes and edges connecting the variable nodes and the check nodes. The variable nodes are related with codeword bits and the check nodes are related with parity check constraints. The component "1" of the PCM corresponds to an edge of the Tanner graph. The number of the edges connected to each node is defined as a degree of the node.

FIGS. 4A, 4B, 4C, 4D and 4E are diagrams illustrating methods of dividing a PCM according to example embodiments.

As a non-limiting example, 24 sub matrices SM11~SM18, SM21~SM28 and SM31~SM38 are illustrated in FIGS. 4A through 4E. Each rectangle represented by a dotted box indicates each sub block in FIGS. 4A through 4E.

Referring to FIGS. 4A through 4E, each of the divided sub blocks may include at least one sub matrix row, at least one sub matrix column and/or at least one sub matrix.

Figure 4A:
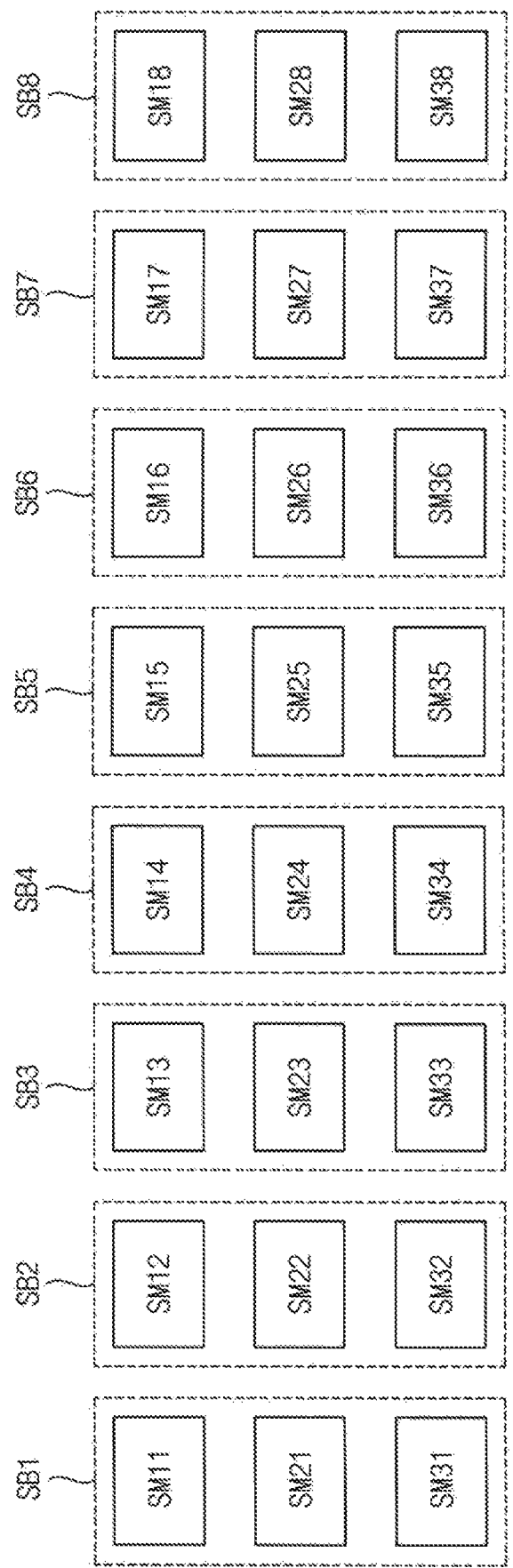
Figure 4B:
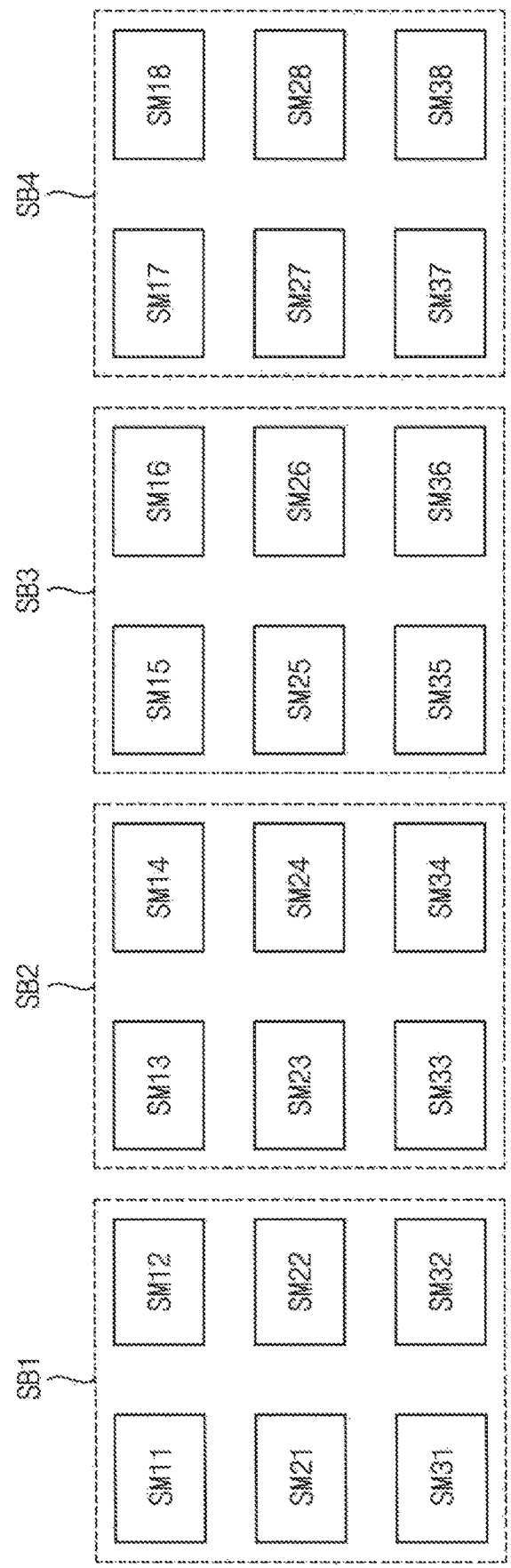
Figure 4C:
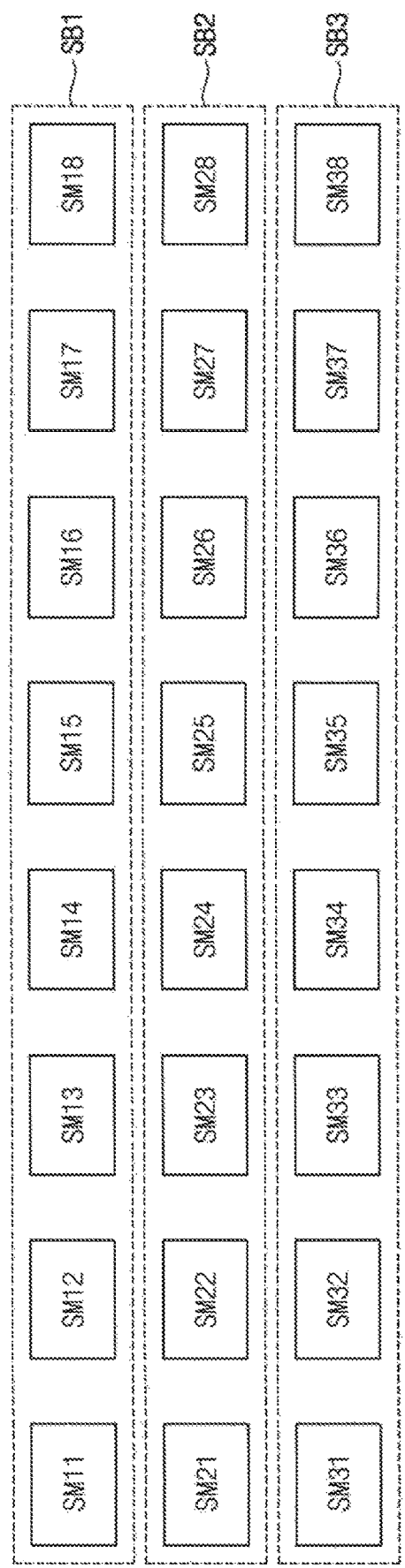
Figure 4D:
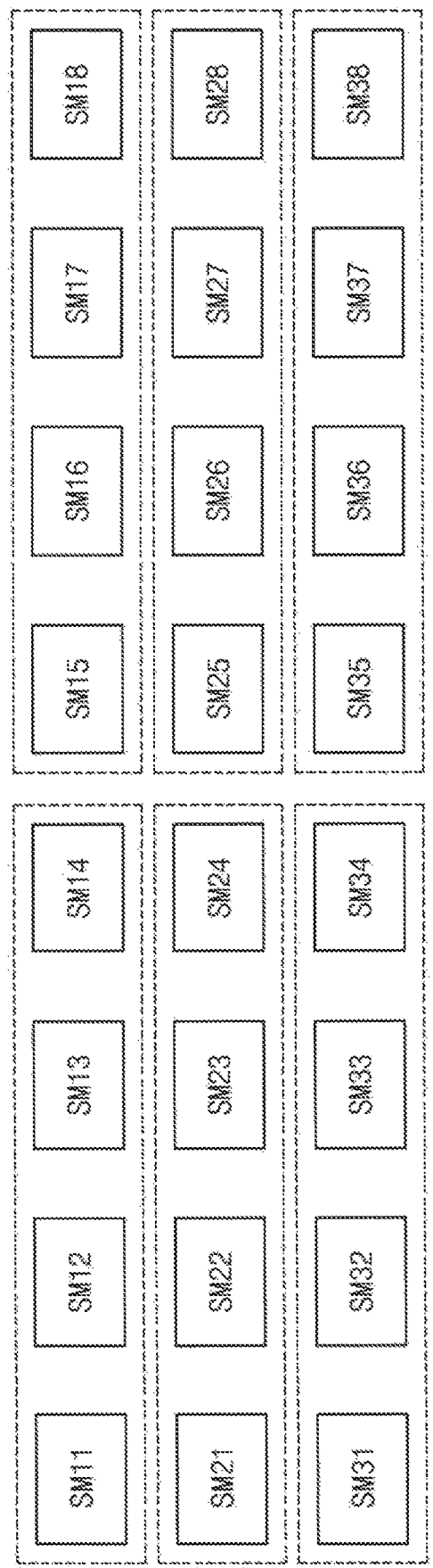

FIG. 4A illustrates a case that the sub matrices are divided into eight sub blocks SB1~SB8 by units of one column, and FIG. 4B illustrates a case that the sub matrices are divided into four sub blocks SB1~SB4 by units of two columns. The decoding based on such division may be referred to as column-by-column decoding. FIG. 4C illustrates a case that the sub matrices are divided into three sub blocks SB1~SB3 by units of one row, and decoding based on such division may be referred to as row-by-row decoding. FIGS. 4D and 4E illustrate other example cases that each sub block includes one or more sub matrixes.

The QC-LDPC code applies structural constraints such as a sub matrix size, a sub matrix shape, etc. to the PCM to facilitate implementation and management of the LDPC decoding. The LDPC decoder is designed to process one or more sub matrices in each clock cycle. Further the LDPC decoder may be designed to process the sub matrices simultaneously by unit of a sub block as illustrated in FIGS. 4A through 4E to improve efficiency of data input-output and calculation. The order of the sub blocks to be updated may be defined, which may be referred to as a decoding schedule of an LDPC code.

Hereinafter, example embodiments are described based on column-by-column decoding, and it will be understood the same example embodiment may be applied to row-by-row decoding.

FIGS. 5A and 5B are diagrams for describing a scheduling table for LDPC code decoding.

As illustrated in FIG. 5A, the PCM ($S_{3\times5}$) in FIG. 3B may be divided into first through fifth sub blocks SB1~SB5 by unit of a column of sub matrices. The decoding schedule for such division may be represented by a scheduling table SCHTB of FIG. 5B.

The scheduling table SCHTB represents a mapping relation between each sub block and a corresponding decoding iteration in which the node operation of each sub block is performed. In other words, each reset iteration number NITR is assigned to each sub block number NSB. In case of the example decoding schedule of FIG. 5B, the first sub block SB1, the third sub block SB3 and the fifth sub block SB5 correspond to target sub blocks in a K-th decoding iteration where K is a natural number, that is, in a present decoding iteration. In other words, the node operation is performed with respect to the first sub block SB1, the third sub block SB3 and the fifth sub block SB5 in the K-th decoding iteration. With respect to the second sub block SB2, the node operation is omitted in the K-th decoding iteration but performed in a (K+1)-th decoding iteration. With respect to the fourth sub block SB4, the node operation is omitted in the K-th and (K+1)-th decoding iterations but performed in a (K+2)-th decoding iteration. Using the scheduling table SCHTB representing such decoding schedule, the adaptive scheduling may be performed as will be described below.

Figure 6:
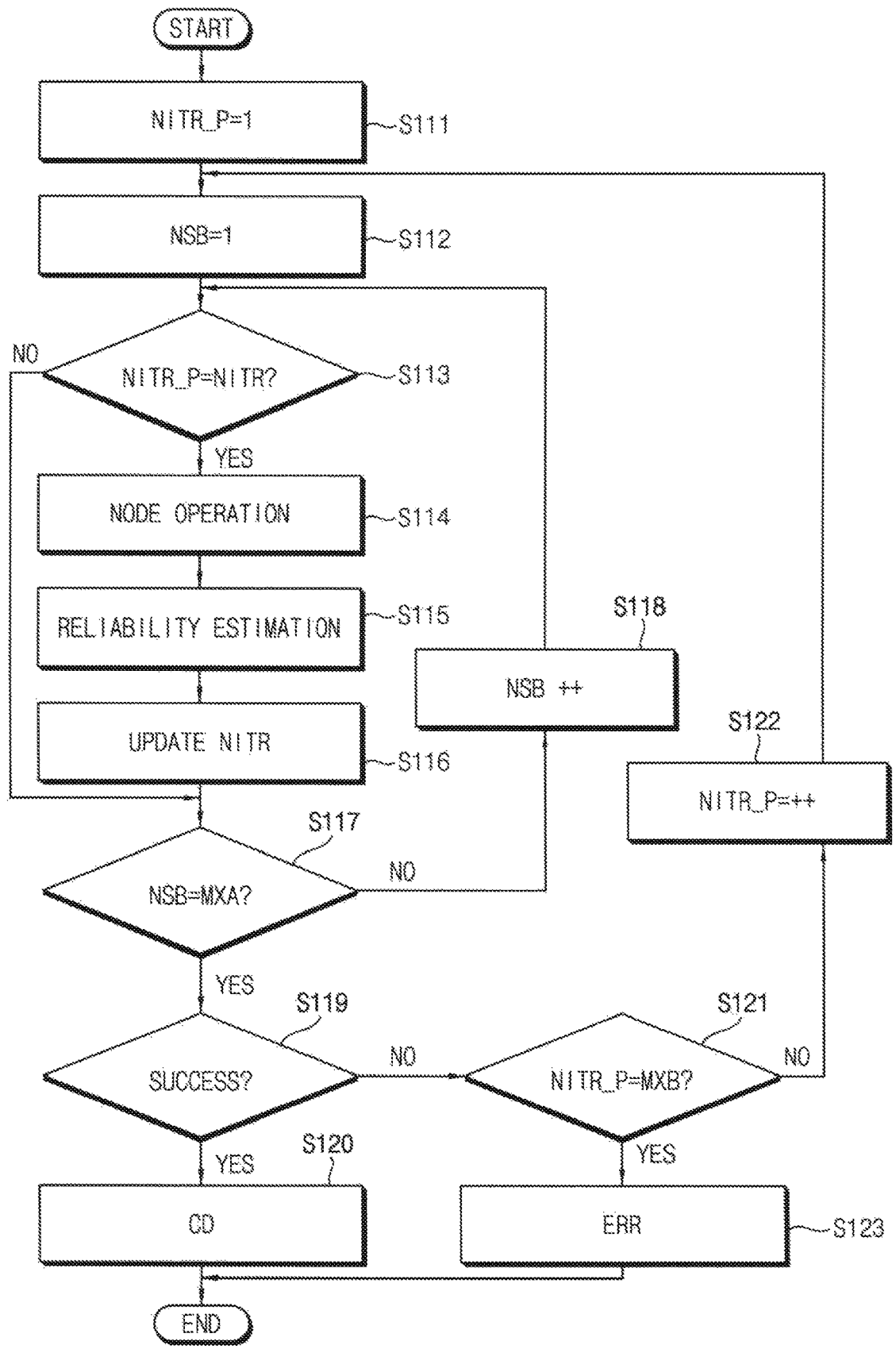
FIG. 6 is a flow chart illustrating a method of decoding an LDPC code according to example embodiments.

FIG. 6 is a flow chart illustrating a method of decoding an LDPC code according to example embodiments.

Referring to FIG. 6, a present iteration number NITR_P is reset to an initial value (e.g., "1") (S111) and a present sub block number NSB is reset to an initial value (e.g., "1) (S112). The present iteration number NITR_P is compared with a reset iteration number NITR that is mapped to the present sub block number NSB (S113).

When the present iteration number NITR_P is equal to the reset iteration number NITR (S113: YES), the node operation of the present sub block is performed (S114), the reliability of the present sub block is estimated (S115) and the reset iteration number NITR mapped to the present sub block number NSB is updated based on the estimated reliability (S116). When the present iteration number NITR_P is different form the reset iteration number NITR (S113: NO), the node operation and the decoding schedule adjustment of the present sub block are omitted.

After that, when the present sub block number NSB is different from a maximum sub block number MXA (S117: NO), the present sub block number NSB is increased by one (S118) and the above sequence (e.g., S113~S117) is repeated with respect to a next sub block.

When the present sub block number NSB is equal to the maximum sub block number MXA (S117: YES), it is determined whether decoding is succeeded (S119). When decoding is successful (S119: YES), corrected data CD are provided (S120) and the decoding process is ended.

When the decoding is not succeeded (S119: NO), the present iteration number NITR_P is compared with a maximum iteration number MXB (S121). When the present iteration number NITR_P is different from the maximum iteration number MXB (S121: NO), the present iteration number NITR_P is increased by one (S122) and the above sequence (e.g., S112~S121) is repeated with respect to a next decoding iteration. When decoding is not succeeded until the last decoding iteration (S121: YES), an error signal ERR is activated (S123) and the decoding process is ended.

Hereinafter, the reliability estimation and the decoding schedule adjustment included in the FIG. 6 will be described with reference to FIGS. 7 through 11E.

FIG. 7 is a flow chart illustrating a method of reliability estimation and decoding schedule adjustment according to example embodiments. FIG. 7 illustrates an example of the reliability estimation and the decoding schedule adjustment for a target sub block after the node operation in the K-th decoding iteration (that is, NITR_P=K). Posteriori probabilities of codeword bits of the target sub block may be calculated based on a decoding message of the target sub block after the node operation of the target sub block is performed, and the reliability may be estimated based on the posteriori probabilities.

Referring to FIG. 7, a present codeword bit number "i" is reset to an initial value (e.g., "1") (S211). The posteriori probability APPi of a present codeword bit is calculated S212, and the posteriori probability APPi is compared with a reference value PTH (S213). For example, the variable node processor 100 in FIG. 2 may calculate the posteriori probability APPi using a channel input and the message MSG transferred from the check node processor 200, and the reliability estimator 300 may determine a value of the reliability signal RB by comparing the provided posteriori probability APPi and the reference value PTH.

When the posteriori probability APPi is lower than the reference value PTH (S213: YES), the value of the reliability signal RB is determined as a first value VL1 (S216). When the posteriori probability APPi is higher than the reference value PTH (S213: NO), the present codeword bit number "i" is compared with a maximum codeword bit number MXC (S214). When the present codeword bit number "i" is different from the maximum codeword bit number MXC (S214: NO), the present codeword bit number "i" is increased by one (S215) and the above sequence (e.g., S212~S214) is repeated with respect to a next codeword bit. When the present codeword bit number "i" is equal to the maximum codeword bit number MXC (S214: YES), the value of the reliability signal RB is determined as a second value VL2 (S217).

As a result, when any one or any combination of the posteriori probabilities APPi (i=1~MXC) is lower than the reference value PTH, the reliability is estimated to be lower than a reference reliability and the reliability is determined as the first value VL1. In contrast, when all of the posteriori probabilities APPi (i=1~MXC) are higher than the reference value PTH, the reliability is estimated to be higher than the reference reliability and the reliability is determined as the second value VL2.

The update manager 400 in FIG. 2 may adjust the decoding schedule based on the value of the reliability signal RB. As described above, the update manager 400 may include the scheduling table SCHTB and the update manager 400 may adjust the decoding schedule by changing the reset iteration number NITR that is mapped to the sub block number NSB in the scheduling table SCHTB.

When the value of the reliability signal RB is the first value VL1 (S311: YES), the update manager 400 may change the reset iteration number NITR mapped to the corresponding sub block from K to K+1 (S312) so that the node operation of the corresponding sub block may be performed in the next decoding iteration, that is, the (K+1)-th decoding iteration. In contrast, When the value of the reliability signal RB is the second value VL2 (S311: NO), the update manager 400 may change the reset iteration number NITR mapped to the corresponding sub block from K to K+2 (S313) so that the node operation of the corresponding sub block may be omitted in the (K+1)-th decoding iteration but performed in the (K+2)-th decoding iteration.

FIG. 8 is a flow chart illustrating a method of reliability estimation and decoding schedule adjustment according to example embodiments. FIG. 8 illustrates an example of the reliability estimation and the decoding schedule adjustment for a target sub block after the node operation in the K-th decoding iteration (that is, NITR_P=K). An error bit number of the target sub block may be calculated based after the node operation of the target sub block is performed, and the reliability may be estimated based on the error bit number.

Referring to FIG. 8, an error bit number NEB of the target sub block after the K-th decoding iteration, that is, after the present decoding iteration (NITR_P=K) is calculated (S411), and the error bit number NEB is compared with a reference value NTH (S412). For example, the calculation of the error bit number NEB may be performed by a syndrome checker 2854 as will be described below with reference to FIG. 14, and the reliability estimator 300 may determine a value of the reliability signal RB by comparing the provided error bit number NEB and the reference value NTH.

When the error bit number NEB is larger than the reference value NTH (S412: YES), the value of the reliability signal RB is determined as a first value VL1 (S413). When the error bit number NEB is smaller than the reference value NTH (S412: NO), the value of the reliability signal RB is determined as a second value VL2 (S414).

As a result, when the error bit number of the target sub block is larger than the reference value NTH, the reliability is estimated to be lower than a reference reliability and the reliability is determined as the first value VL1. In contrast, when the error bit number of the target sub block is smaller than the reference value NTH, the reliability is estimated to be higher than the reference reliability and the reliability is determined as the second value VL2.

The update manager 400 in FIG. 2 may adjust the decoding schedule based on the value of the reliability signal RB. As described above, the update manager 400 may include the scheduling table SCHTB and the update manager 400 may adjust the decoding schedule by changing the reset iteration number NITR that is mapped to the sub block number NSB in the scheduling table SCHTB.

When the value of the reliability signal RB is the first value VL1 (S511: YES), the update manager 400 may change the reset iteration number NITR mapped to the corresponding sub block from K to K+1 (S512) so that the node operation of the corresponding sub block may be performed in the next decoding iteration, that is, the (K+1)-th decoding iteration. In contrast, When the value of the reliability signal RB is the second value VL2 (S511: NO), the update manager 400 may change the reset iteration number NITR mapped to the corresponding sub block from K to K+2 (S513) so that the node operation of the corresponding sub block may be omitted in the (K+1)-th decoding iteration but performed in the (K+2)-th decoding iteration.

FIGS. 9A, 9B, 9C, 9D, 9E and 9F are diagrams illustrating an example sequence of updating a scheduling table by the methods of FIGS. 7 and 8.

FIGS. 9A through 9F illustrate the decoding schedule adjustment with respect to the two sequential decoding iterations, that is, a K-th decoding iteration (NITR_P=K) and a (K+1)-th decoding iteration (NITR_P=K+1). In each figures, a state SCHTB(BEFORE) before the adjustment and a state SCHTB(AFTER) after the adjustment of the scheduling table SCHTB are illustrated.

Referring to FIGS. 9A and 9B, the second sub block SB2 and the fourth sub block SB4 correspond to the target sub blocks in the k-th decoding iteration because the reset iteration number NITR of the second and fourth blocks SB2 and SB4 is equal to the present iteration number NITR_P of K. In case of the second sub block SB2, because the value of the reliability signal RB is the second value VL2, the reliability is estimated to be relatively high and the reset iteration number NITR is set to K+2. In case of the fourth sub block SB4, because the value of the reliability signal RB is the first value VL1, the reliability is estimated to be relatively low and the reset iteration number NITR is set to K+1. As a result, the node operation of the second sub block SB2 of the high reliability may be omitted in the (K+1)-th decoding iteration but performed in the (K+2)-th decoding iteration. In contrast, the node operation of the fourth sub block SB4 of the low reliability may be performed in the (K+1)-th decoding iteration.

Referring to FIGS. 9C through 9F, the first sub block SB1, the third sub block SB3, the fourth sub block SB4 and the fifth sub block SB5 correspond to the target sub blocks in the (k+1)-th decoding iteration because the reset iteration number NITR of the first, third, fourth and fifth sub blocks SB1, SB3, SB4 and SB5 is equal to the present iteration number NITR_P of K+1. In case of the first and third sub blocks SB1 and SB3, because the value of the reliability signal RB is the second value VL2, the reliability is estimated to be relatively high and the reset iteration number NITR is set to K+3. In case of the fourth and fifth sub blocks SB4 and SB5, because the value of the reliability signal RB is the first value VL1, the reliability is estimated to be relatively low and the reset iteration number NITR is set to K+2. As a result, the node operation of the first and third sub blocks SB1 and SB3 of the high reliability may be omitted in the (K+2)-th decoding iteration but performed in the (K+3)-th decoding iteration. In contrast, the node operation of the fourth and fifth sub blocks SB4 and SB5 of the low reliability may be performed in the (K+2)-th decoding iteration.

As described with reference to FIGS. 7 through 9F, the result of the node operation may be compared with a reference value with respect to each of the target sub blocks in the K-th decoding iteration. The reliability may be estimated such that the reliability is determined as the first value when the reliability is estimated to be lower than a reference reliability based on the result of the comparison, and the reliability is determined as the second value when the reliability is estimated to be higher than the reference reliability based on the result of the comparison. When the reliability of the target sub block is the first value, the decoding schedule may be adjusted such that the node operation of the target sub block is performed in the (K+1)-th decoding iteration. When the reliability of the target sub block is the second value, the decoding schedule may be adjusted such that the node operation of the target sub block is not performed in the (K+1)-th decoding iteration but performed in a (K+2)-th decoding iteration.

As a result, when the reliability of the target sub block is estimated to be higher than the reference reliability in the present decoding iteration, the node operation of the target sub block may be omitted in the next decoding operation. As such, the method of decoding an LDPC code, the LDPC decoder and the memory system including the LDPC decoder according to example embodiments may reduce a decoding time and power consumption by adaptively adjusting the decoding schedule based on the result of the node operation.

Figure 10:
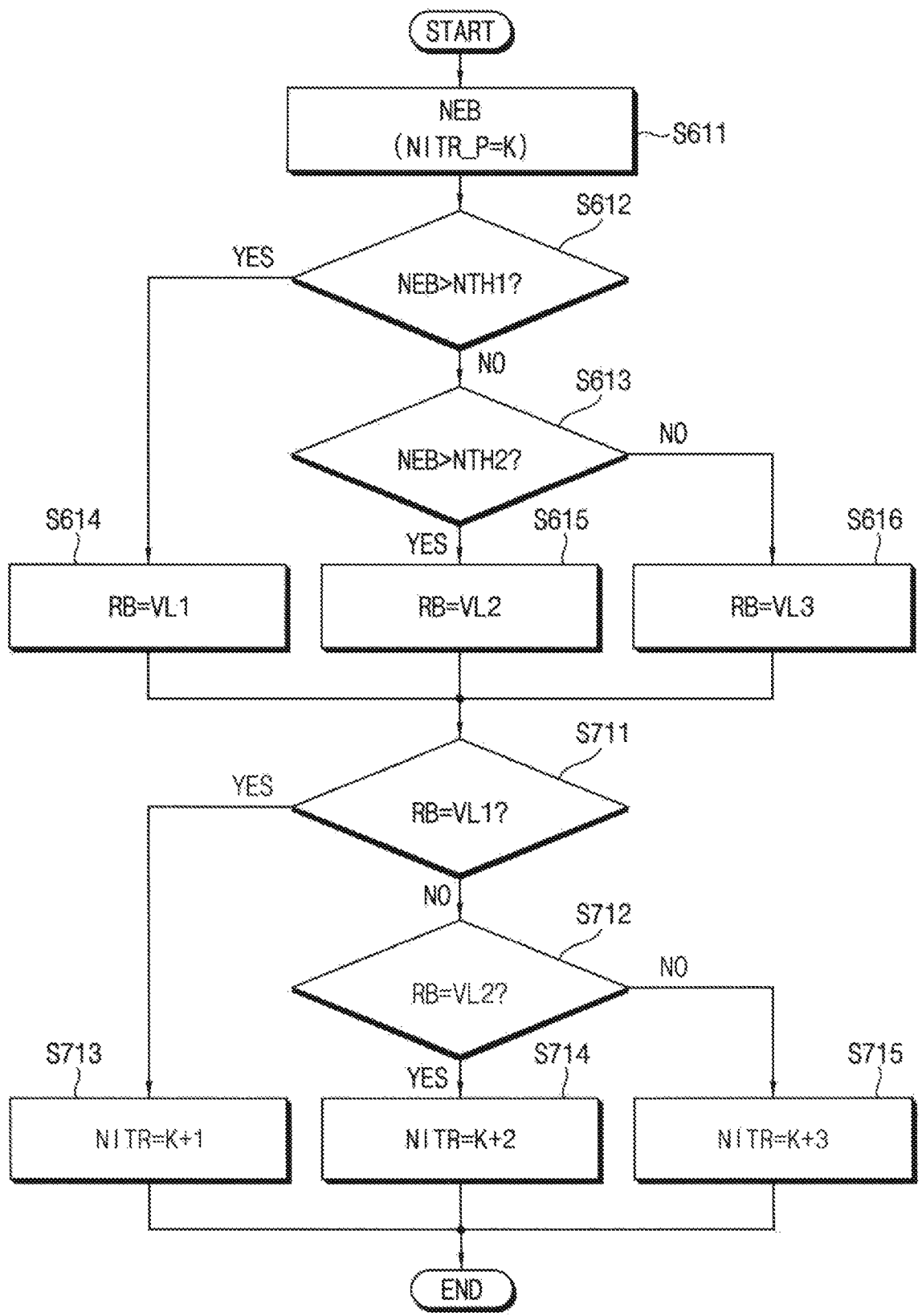
FIG. 10 is a flow chart illustrating a method of reliability estimation and decoding schedule adjustment according to example embodiments.

FIG. 10 is a flow chart illustrating a method of reliability estimation and decoding schedule adjustment according to example embodiments. FIG. 10 illustrates an example of the reliability estimation and the decoding schedule adjustment for a target sub block after the node operation in the K-th decoding iteration (that is, NITR_P=K). An error bit number of the target sub block may be calculated based after the node operation of the target sub block is performed, and the reliability may be estimated based on the error bit number.

Referring to FIG. 10, an error bit number NEB of the target sub block after the K-th decoding iteration, that is, after the present decoding iteration (NITR_P=K), is calculated (S611), and the error bit number NEB is compared with a first reference value NTH1 and a second reference value NTH2 (S612, S613). For example, the calculation of the error bit number NEB may be performed by a syndrome checker 2854 as will be described below with reference to FIG. 14, and the reliability estimator 300 may determine a value of the reliability signal RB by comparing the provided error bit number NEB and the reference value NTH.

When the error bit number NEB is larger than the first reference value NTH1 (S612: YES), the value of the reliability signal RB is determined as a first value VL1 (S614). When the error bit number NEB is smaller than the first reference value NTH1 (S612: NO) and larger the second reference value NTH2 (S613: YES), the value of the reliability signal RB is determined as a second value VL2 (S615). When the error bit number NEB is smaller than the first reference value NTH1 (S612: NO) and smaller than the second reference value NTH2 (S613: NO), the value of the reliability signal RB is determined as a third value VL3 (S616).

As a result, when the error bit number of the target sub block is larger than the first reference value NTH1, the reliability is estimated to be lower than a first reference reliability and the reliability is determined as the first value VL1. When the error bit number of the target sub block is smaller than the first reference value NTH1 and larger than the second reference value NTH2, the reliability is estimated to be lower than the first reference reliability and higher than a second reference reliability and the reliability is determined as the second value VL1. When the error bit number of the target sub block is smaller the second reference value NTH2, the reliability is estimated to be higher than the second reference reliability and the reliability is determined as the third value VL3. Here, the first reference value NTH1 is larger than the second reference value NTH2 and the first reference reliability is lower than the second reference reliability.

The update manager 400 in FIG. 2 may adjust the decoding schedule based on the value of the reliability signal RB. As described above, the update manager 400 may include the scheduling table SCHTB and the update manager 400 may adjust the decoding schedule by changing the reset iteration number NITR that is mapped to the sub block number NSB in the scheduling table SCHTB.

When the value of the reliability signal RB is the first value VL1 (S711: YES), the update manager 400 may change the reset iteration number NITR mapped to the corresponding sub block from K to K+1 (S713) so that the node operation of the corresponding sub block may be performed in the next decoding iteration, that is, the (K+1)-th decoding iteration. When the value of the reliability signal RB is the second value VL2 (S712: YES), the update manager 400 may change the reset iteration number NITR mapped to the corresponding sub block from K to K+2 (S714) so that the node operation of the corresponding sub block may be omitted in the (K+1)-th decoding iteration but performed in the (K+2)-th decoding iteration. When the value of the reliability signal RB is the third value VL3 (S712: NO), the update manager 400 may change the reset iteration number NITR mapped to the corresponding sub block from K to K+3 (S715) so that the node operation of the corresponding sub block may be omitted in the (K+1)-th and (K+2)-th decoding iterations but performed in the (K+3)-th decoding iteration.

FIGS. 11A, 11B, 11C, 11D and 11E are diagrams illustrating an example sequence of updating a scheduling table by the method of FIG. 10.

FIGS. 11A through 11E illustrate the decoding schedule adjustment with respect to the two sequential decoding iterations, that is, a K-th decoding iteration (NITR_P=K) and a (K+1)-th decoding iteration (NITR_P=K+1). In each figures, a state SCHTB(BEFORE) before the adjustment and a state SCHTB(AFTER) after the adjustment of the scheduling table SCHTB are illustrated.

Figure 11A:
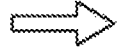
FIGS. 11A, 11B, 11C, 11D and 11E are diagrams illustrating an example sequence of updating a scheduling table by the method of FIG. 10.
Figure 11B:
Figure 11C:
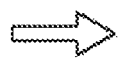

Referring to FIGS. 11A, 11B and 11C, the first sub block SB1, the second sub block SB2 and the fourth sub block SB4 correspond to the target sub blocks in the k-th decoding iteration because the reset iteration number NITR of the first, second and fourth blocks SB1, SB2 and SB4 is equal to the present iteration number NITR_P of K. In case of the first sub block SB1, because the value of the reliability signal RB is the first value VL1, the reliability is estimated to be relatively low and the reset iteration number NITR is set to K+1. In case of the second sub block SB2, because the value of the reliability signal RB is the third value VL3, the reliability is estimated to be relatively high and the reset iteration number NITR is set to K+3. In case of the fourth sub block SB4, because the value of the reliability signal RB is the third value VL3, the reliability is estimated to be relatively high and the reset iteration number NITR is set to K+3. As a result, the node operation of the second sub block SB2 of the high reliability may be omitted in the (K+1)-th and (K+2)-th decoding iterations but performed in the (K+3)-th decoding iteration. The node operation of the fourth sub block SB4 of the intermediate reliability may be omitted in the (K+1)-th decoding iteration but performed in the (K+2)-th decoding iteration. The node operation of the first sub block SB1 of the low reliability may be performed in the (K+1)-th decoding iteration.

Figure 11D:
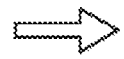
Figures 11E, 12:
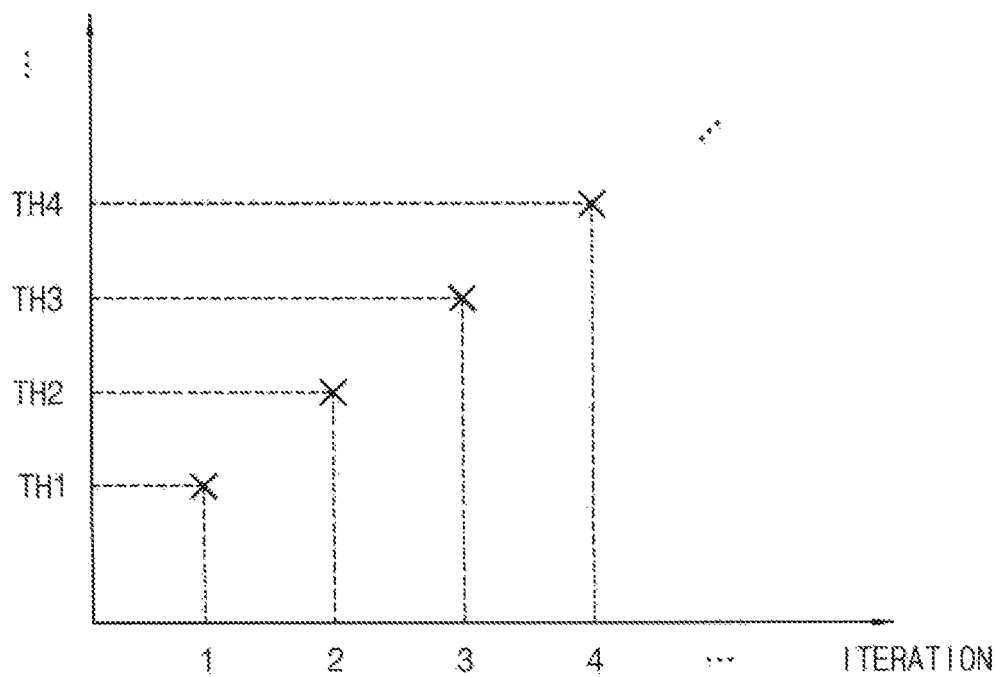
FIG. 12 is a diagram illustrating a method of determining a reference reliability according to example embodiments.

Referring to FIGS. 11D through 11E, the first sub block SB1 and the third sub block SB3 correspond to the target sub blocks in the (k+1)-th decoding iteration because the reset iteration number NITR of the first and third sub blocks SB1 and SB3 is equal to the present iteration number NITR_P of K+1. In case of the first sub block SB1, because the value of the reliability signal RB is the first value VL1, the reliability is estimated to be low and the reset iteration number NITR is set to K+2. In case of the third sub block SB3, because the value of the reliability signal RB is the third value VL3, the reliability is estimated to be high and the reset iteration number NITR is set to K+4. As a result, the node operation of the first sub block SB1 of the low reliability may be performed in the (K+2)-th decoding iteration. In contrast, the node operation of the third sub block SB3 of the high reliability may be omitted in the (K+2)-th and (K+3)-th decoding iterations but performed in the (K+4)-th decoding iteration.

As described with reference to FIGS. 10 through 11E, the result of the node operation may be compared with two reference values with respect to each of the target sub blocks in the K-th decoding iteration, and the reliability may be estimated as one of three ranges. The reliability may be estimated such that the reliability is determined as the first value when the reliability is estimated to be in a low range, the reliability is determined as the second value when the reliability is estimated to be in an intermediate range and the reliability is determined as the third value when the reliability is estimated to be in a high ranged. When the reliability of the target sub block is the first value, the decoding schedule may be adjusted such that the node operation of the target sub block is performed in the (K+1)-th decoding iteration. When the reliability of the target sub block is the second value, the decoding schedule may be adjusted such that the node operation of the target sub block is not performed in the (K+1)-th decoding iteration but performed in a (K+2)-th decoding iteration. When the reliability of the target sub block is the third value, the decoding schedule may be adjusted such that the node operation of the target sub block is not performed in the (K+1)-th and (K+2)-th decoding iterations but performed in a (K+3)-th decoding iteration.

Even though the example embodiments that the reliability is estimated as one of three ranges using the two reference value are described with reference to FIGS. 10 through 11E, the reliability may be estimated as one of four or more ranges using three or more reference values.

As a result, when the reliability of the target sub block is estimated to be relatively high in the present decoding iteration, the node operation of the target sub block may be omitted in at least one subsequent decoding operation. As such, the method of decoding an LDPC code, the LDPC decoder and the memory system including the LDPC decoder according to example embodiments may reduce a decoding time and power consumption by adaptively adjusting the decoding schedule based on the result of the node operation.

FIG. 12 is a diagram illustrating a method of determining a reference reliability according to example embodiments.

In FIG. 12, the horizontal axis indicates a decoding iteration number and the vertical axis indicates reliability. TH1~TH4 are reference reliabilities corresponding to first through fourth decoding iterations, respectively. As illustrated in FIG. 12, the reference reliability may be increased as the decoding iteration is repeated. The number of the sub blocks of higher reliability may be increased as the decoding iteration is repeated. Thus the reference reliability may be set to be changed according to the decoding iteration number and efficiency of the adaptive scheduling may be further enhanced. Even though FIG. 12 illustrates the linear increase of the reference reliability according to the decoding iteration number, example embodiments are limited thereto.

Figure 13:
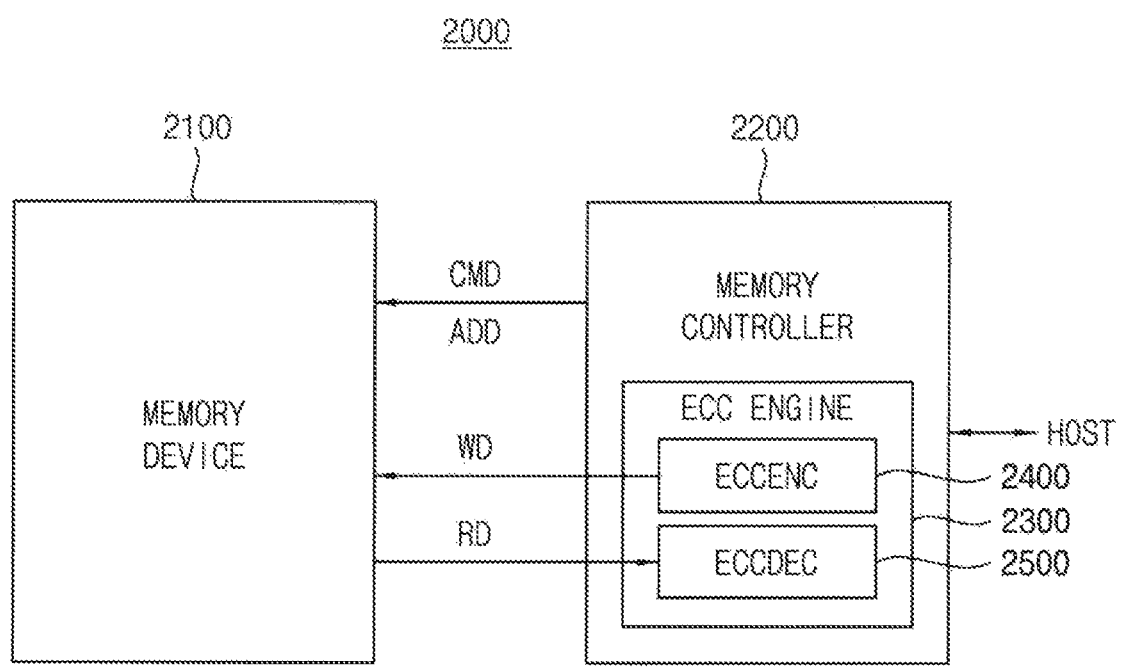
FIG. 13 is a block diagram illustrating a memory system according to example embodiments.

FIG. 13 is a block diagram illustrating a memory system according to example embodiments.

Referring to FIG. 13, a semiconductor memory system 3000 may include a memory device 2100 and a memory controller 2200. In some example embodiments, the memory device 2100 may include a nonvolatile memory device (e.g., flash memory device). In this case, the memory controller 2100 may store data by adjusting a threshold voltage of memory cells.

The memory controller 2200 is connected to a host and the memory device 2100. The memory controller 2200 is configured to access the memory device 2100 in response to a request from the host. For example, the memory controller 2200 is configured to control read, write, erase, and background operations of the memory device 2100, to provide an interface between the memory device 2100 and the host. The memory controller 2200 provides a command CMD and an address ADD to the memory device 2100 to exchange read data RD and write data WD with the memory device 2100.

The memory controller 2200 includes an error correction code (ECC) engine 2300, and the ECC engine 2300 includes an ECC encoder 2400 (ECCENC) and an ECC decoder 2400 (ECCDEC).

If the data are received from the host, the received data may be encoded by the ECC encoder 2400. The ECC encoder 2400 may perform LDPC encoding of the received data using a parity check matrix. The encoded data are provided to and stored in the memory device 2100 as write data. The write data may include parity bits for decoding.

Upon the read request from the host, the memory controller read out the stored data in the memory device 2100 as read data. The read data may include errors due to various causes. For example, the errors may be caused by an abnormal write operation, an abnormal read operation, and/or a data loss in the memory device 2100. The ECC decoder 2500 may perform LDPC decoding of the read data using the parity check matrix to remove the errors in the read data. The parity check matrix used in the LDPC decoding is the same as the parity check matrix used in the LDPC encoding. The result of the LDPC decoding may be provided as corrected data.

Figure 14:
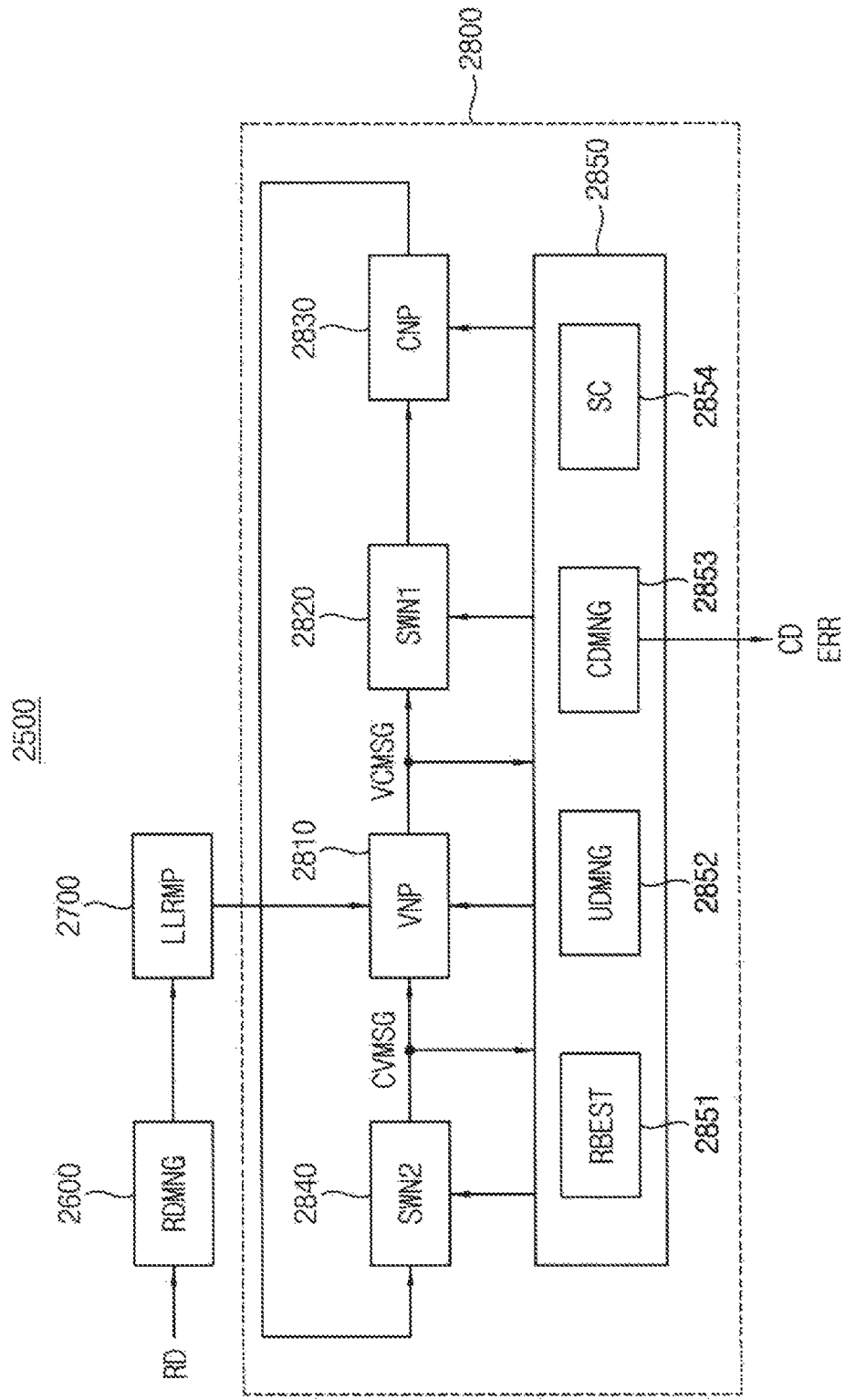
FIG. 14 is a block diagram illustrating example embodiments of an error correction code (ECC) decoder included in the memory system of FIG. 13.

FIG. 14 is a block diagram illustrating example embodiments of an error correction code (ECC) decoder included in the memory system of FIG. 13.

Referring to FIG. 14, the ECC decoder 2500 may include a read data manager 2600 (RDMNG), a log likelihood ratio mapper 2700 (LLRMP), and a decoder 2800.

The read data manager 2600 receives and stores read data RD read from the memory device 2100. The read data RD may include first read data RD1 and second read data RD2.

When a hard decision is conducted, the read data manager 2600 receives data read using a normal read voltage from the memory device 2100 and stores the received data as the first read data RD1. The stored first read data RD1 may be provided to the LLR mapper 2700 during a hard decision or a soft decision.

When a soft decision is conducted, the read data manager 2600 receives data read using a partial read voltage from the memory device 2100 and stores the received data as the second read data RD2. The partial read voltage means a voltage that is proximate to the normal read voltage but has a different voltage level than the normal read voltage. When the soft decision is conducted, the read data manager 2600 provides the second read data RD2 to the LLR mapper 2700.

The LLR mapper 2700 is configured to map the LLR values to the provided read data RD1 and RD2. In some example embodiments, the LLR mapper 2700 may include a hard decision LLR register storing LLR values to be mapped during a hard decision and a soft decision LLR register storing LLR values to be mapped during the soft decision.

During the hard decision, the LLR mapper 2700 receives the first read data RD1 from the read data manager 2600. The LLR mapper 2700 maps the first read data RD1 with corresponding LLR values according to each bit value of the first read data RD1. During the soft decision, the LLR mapper 2700 receives the second read data RD2 from the read data manager 2600. The LLR mapper 2700 maps the second read data RD2 with corresponding LLR values according to each bit value of the second read data RD2. During the hard decision or the soft decision, a result of the mapping carried out by the LLR mapper 2700 is output to the decoder 2800 as LLR data.

The decoder 2800 performs LDPC decoding on the received LLR data. During the hard decision and the soft decision, respective LLR data may be LDPC—decoded using the same method and device. The decoder 2800 updates check nodes and variable nodes according to a parity check matrix during the LDPC decoding. The decoder 2800 performs provisional decoding according to a result of the update (e.g., posteriori probability) and computes the provisionally decoded data and the parity check matrix to determine whether decoding is correctly performed according to a result of the computation.

For example, if the result of computation with the parity check matrix is a zero matrix, it is determined that the decoding is correctly performed. If not a zero matrix, it is determined that the decoding is not correctly performed. If the decoding is correctly performed, the decoder 2800 outputs the decoded data as decoded data CD. If the decoding is not correctly performed (i.e., all errors of the read data RD are not corrected), the decoder 2800 re-updates the check nodes and the variable nodes.

The above update and provisional decoding of check nodes and variable nodes are iteratively performed. The update and provisional decoding of check nodes and variable nodes may constitute a single decoding loop, that is, a decoding iteration.

When the hard decision is conducted in the decoder 2800 and parity check based on the hard decision is failed, the decoder 2800 transmits a fail message to the read data manager 2600. The read data manager 2600 transmits a read request for the soft decision to the memory controller 2200 in FIG. 13 in response to the fail message. Alternatively, when the hard decision is conducted in the decoder 2800 and parity check based on the hard decision is failed, the decoder 2800 directly transmits a fail message to the memory controller 2200. The memory controller 2200 may prepare a read operation for the soft decision in response to the fail message or a read request.

The decoder 2800 may include a variable node processor 2810 (VNP), a first switch network 2820 (SWN1), a check node processor 2830 (CNP), a second switch network 2840 (SWN2), and a controller 2850. The controller 2850 may include a reliability estimator 2851 (RBEST), an update manager 2852 (UDMNG), a corrected data manager 2853 (CDMNG) and a syndrome checker 2854 (SC).

During the LDPC decoding, a nonzero element in the parity check matrix means that a corresponding variable node and a corresponding check node are connected to each other. The decoding is performed through data transmitted according to the connection of the variable node and the check node.

The variable node processor 2810 stores the provided LLR data from the read data manager 2600 and provides the stored LLR data, as a variable node message VCMSG, to the check node processor 2830 through the first switch network 2820.

The check node processor 2830 compares values of variable nodes with respect to each check node with reference to the provided variable node message VCMSG to provide a check node message CVMSG. The check node message CVMSG provided to the variable node processor 2810 through the second switch network 2810.

The variable node processor 2810 updates values of the variable and check nodes with reference to the received check node message CVMSG. The variable node processor 2810 performs decoding according to the updated values of the variable and check nodes. A result of the decoding is provided to the corrected data manager 2853 as decoding data.

The corrected data manager 2853 stores the result of the decoding performed in the variable node processor 2810 and outputs the corrected data CD or a read error message ERR to an external device depending on whether decoding of the syndrome checker 2854 is successfully performed.

The syndrome checker 2854 determines whether the decoding is successfully performed, according to the decoding data stored in the corrected data manager 2853. For example, the syndrome checker 2854 multiplies the decoding data by a transpose matrix of the parity check matrix and determines whether the decoding is successfully performed (or whether all errors are corrected) depending on whether a result of the multiplication is a zero matrix. The syndrome checker 2854 provides a result of the determination to the corrected data manager 2853.

The reliability estimator 2851 estimates a reliability of each of the target sub blocks based on a result of the node operation in a present decoding iteration. The update manager adjusts the decoding schedule corresponding to a next decoding iteration based on the reliability. The adaptive scheduling according to example embodiments may be performed by controlling the operations of the variable node processor 2810, the first switch network 2820, the check node processor 2830 and the second switch network 2840 based on the adjusted decoding schedule.

Figure 15A:
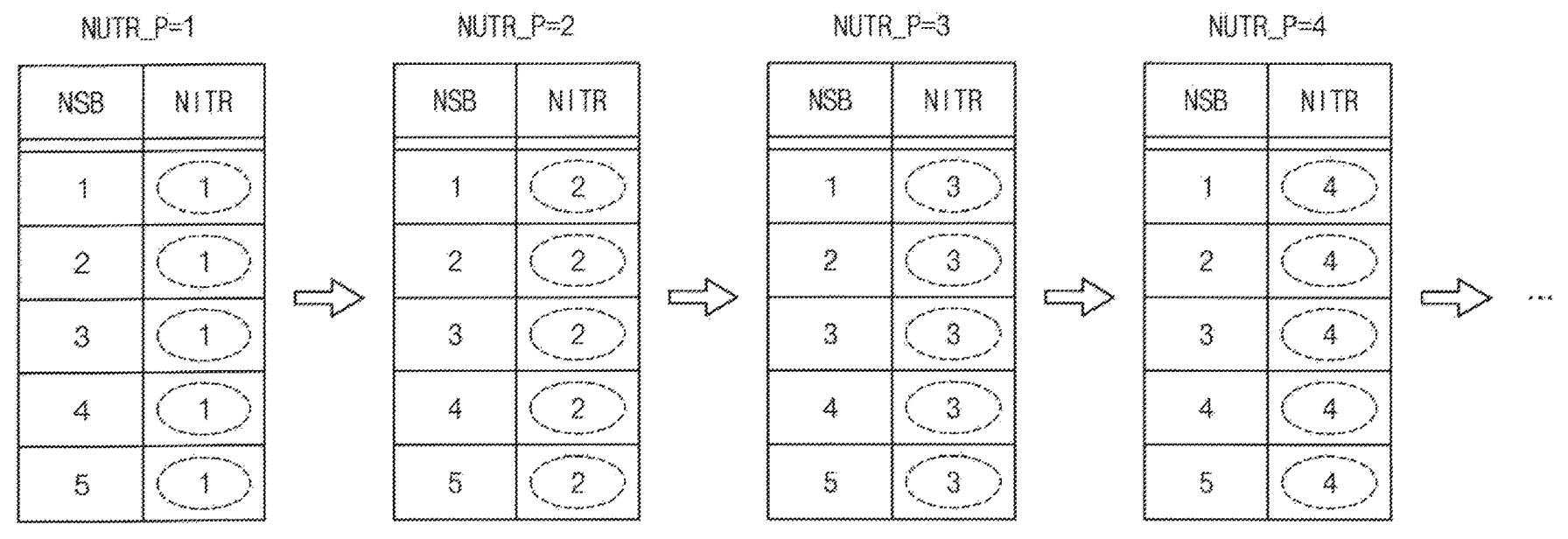
Figure 15B:
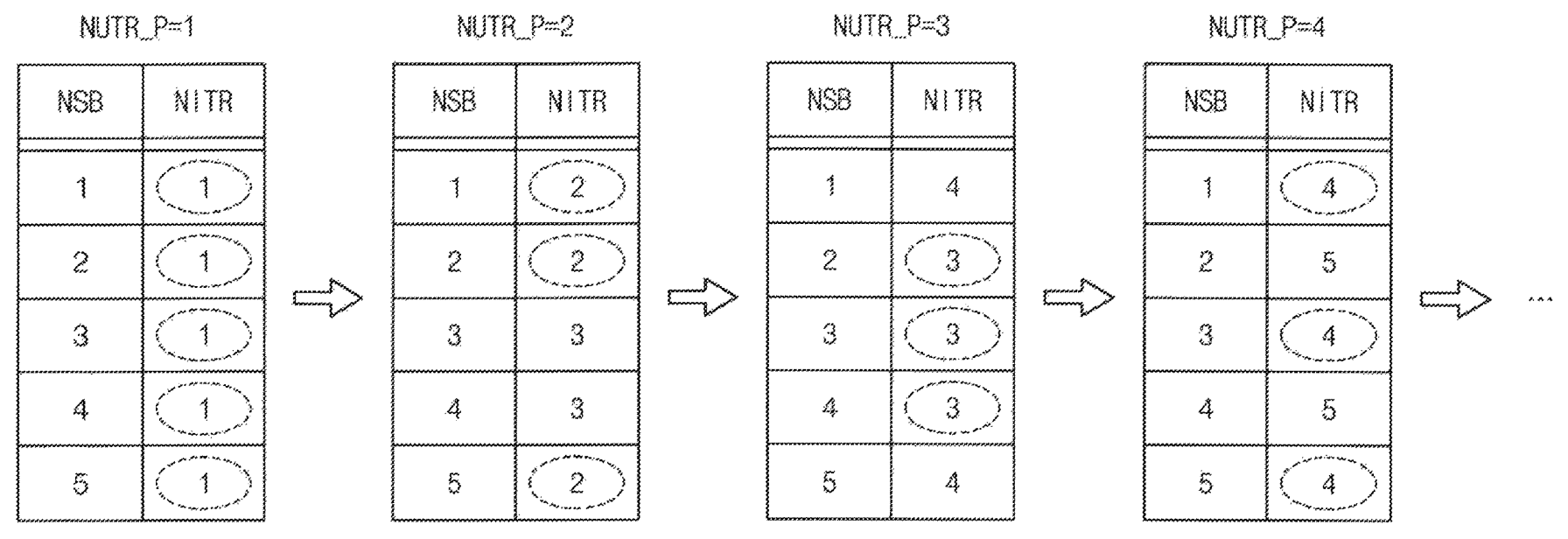

FIGS. 15A and 15B are diagrams for describing reduction of a decoding time according to example embodiments. FIG. 15A illustrates a sequential scheduling and FIG. 15B illustrates an adaptive scheduling according to example embodiments.

FIGS. 15A and 15B illustrates a mapping relation of a scheduling table corresponding to first through fourth decoding iterations NITR_P=1~4. As described above, NSB is a sub block number, and NITR is a reset iteration number mapped to each sub block number. The reset iteration number NITR indicates the decoding iteration number that the node operation has to be performed with respect to the corresponding sub block. The dotted circles indicate the above-described target sub blocks corresponding to cases that the reset iteration number NITR is the same as the present iteration number NITR_P.

As described above, through the repeated decoding iterations during the LDPC decoding process, the values received from a channel converge on a codeword. The error bit number is decreased gradually as the decoding iteration is repeated and a sub block having no bit error may occur according as the repetition of the decoding iteration progresses. Updating the sub block having no bit error or the small number of bit errors does not influence on improvement of the decoding result, which leads to increase in a decoding time and power consumption.

According to example embodiments, the decoding or the node operation of some sub blocks may be omitted based on the estimated reliability in each decoding iteration. The reset iteration number NITR may be initialized so that all sub blocks may be the target sub blocks in the first decoding iteration. In case of the sequential scheduling of FIG. 15A, twenty sub block processes are performed during the four decoding iterations. In contrast, only fourteen sub block processes are performed during the four decoding iterations in case of the adaptive scheduling of FIG. 15B.

As such, the method of decoding an LDPC code, the LDPC decoder and the memory system including the LDPC decoder according to example embodiments may reduce a decoding time and power consumption by adaptively adjusting the decoding schedule based on the result of the node operation.

Figure 16:
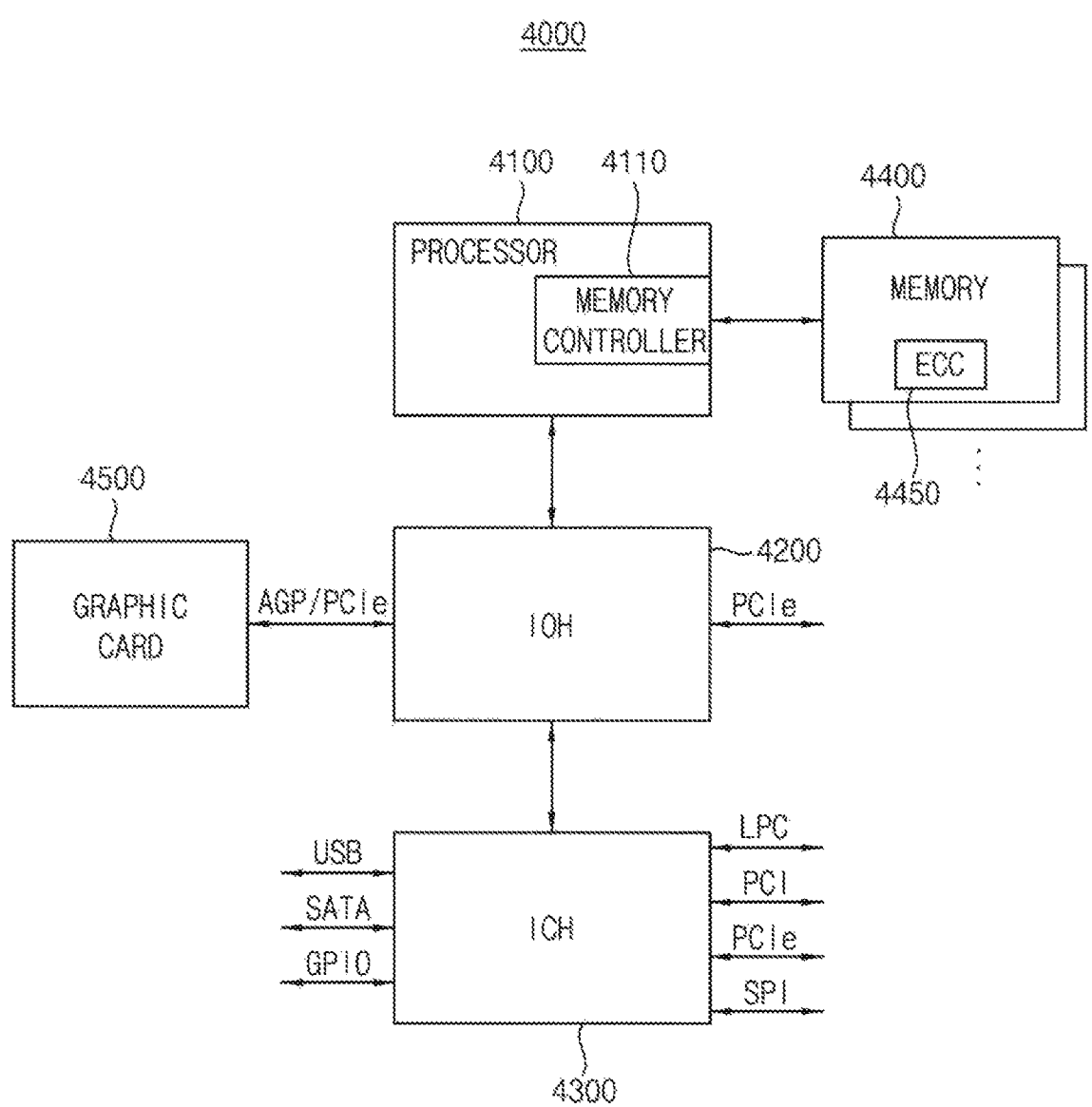
FIG. 16 is a block diagram illustrating a computing system according to example embodiments.

FIG. 16 is a block diagram illustrating a computing system according to example embodiments.

Referring to FIG. 16, a computing system 4000 includes a processor 4100, an input/output hub 4200 (IOH), an input/output controller hub 4300 (ICH), at least one memory 4400, and a graphic card 4500.

The processor 4100 may perform various computing functions such as executing software for performing calculations or tasks. For example, the processor 4100 may be a microprocessor, a central process unit (CPU), a digital signal processor, or the like. The processor 4100 may include a memory controller 4110 for controlling operations of the memory 4400. The memory 4400 may include a plurality of memory devices that store data provided from the memory controller 4110. An ECC decoder 4450 (ECC) may be an LDPC decoder to perform LDPC decoding based on adaptive scheduling according to example embodiments as described above. In some example embodiments, as illustrated in FIG. 16, the ECC decoder may be included in the memory 4400. In this case, the ECC decoder 4450 may be embedded in a buffer chip and/or memory chips in the memory 4400. In other example embodiments, the ECC decoder 4450 may be included in the memory controller 4410.

The input/output hub 4200 may manage data transfer between processor 4100 and devices, such as the graphic card 4500. The graphics card 4500 may control a display device for displaying an image. The input/output controller hub 4300 may perform data buffering and interface arbitration to efficiently operate various system interfaces. The components in FIG. 16 may be coupled various interfaces, such as an accelerated graphics port (AGP) interface, a peripheral component interface (PCI), a peripheral component interface-express (PCIe), a universal serial bus (USB) port, a serial advanced technology attachment (SATA) port, a low pin count (LPC) bus, a serial peripheral interface (SPI), a general purpose input/output (GPIO), etc.

As described above, the method of decoding an LDPC code, the LDPC decoder and the memory system including the LDPC decoder according to example embodiments may reduce a decoding time and power consumption by adaptively adjusting the decoding schedule based on the result of the node operation.

The example embodiments may be applied to any devices and systems in which an LDPC code is decoded. For example, the example embodiments may be applied to systems such as be a mobile phone, a smart phone, a personal digital assistant (PDA), a portable multimedia player (PMP), a digital camera, a camcorder, personal computer (PC), a server computer, a workstation, a laptop computer, a digital TV, a set-top box, a portable game console, a navigation system, etc.

As is traditional in the field of the inventive concepts, the example embodiments are described, and illustrated in the drawings, in terms of functional blocks, units and/or modules. Those skilled in the art will appreciate that these blocks, units and/or modules are physically implemented by electronic (or optical) circuits such as logic circuits, discrete components, microprocessors, hard-wired circuits, memory elements, wiring connections, and the like, which may be formed using semiconductor-based fabrication techniques or other manufacturing technologies. In the case of the blocks, units and/or modules being implemented by microprocessors or similar, they may be programmed using software (e.g., microcode) to perform various functions discussed herein and may optionally be driven by firmware and/or software. Alternatively, each block, unit and/or module may be implemented by dedicated hardware, or as a combination of dedicated hardware to perform some functions and a processor (e.g., one or more programmed microprocessors and associated circuitry) to perform other functions. Also, each block, unit and/or module of the example embodiments may be physically separated into two or more interacting and discrete blocks, units and/or modules without departing from the scope of the inventive concepts. Further, the blocks, units and/or modules of the example embodiments may be physically combined into more complex blocks, units and/or modules without departing from the scope of the inventive concepts.

The various operations of methods described above may be performed by any suitable means capable of performing the operations, such as various hardware and/or software component(s), circuits, and/or module(s).

The software may include an ordered listing of executable instructions for implementing logical functions, and can be embodied in any "processor-readable medium" for use by or in connection with an instruction execution system, apparatus, or device, such as a single or multiple-core processor or processor-containing system.

The blocks or steps of a method or algorithm and functions described in connection with the example embodiments disclosed herein may be embodied directly in hardware, in a software module executed by a processor, or in a combination of the two. If implemented in software, the functions may be stored on or transmitted over as one or more instructions or code on a tangible, non-transitory computer-readable medium. A software module may reside in Random Access Memory (RAM), flash memory, Read Only Memory (ROM), Electrically Programmable ROM (EPROM), Electrically Erasable Programmable ROM (EEPROM), registers, hard disk, a removable disk, a CD ROM, or any other form of storage medium known in the art.

The foregoing is illustrative of the example embodiments and is not to be construed as limiting thereof. Although a few example embodiments have been described, those skilled in the art will readily appreciate that many modifications are possible in the example embodiments without materially departing from the present inventive concept.

What is claimed is:

1. A method of decoding a low density parity check (LDPC) code, the method comprising:
   dividing a parity check matrix of the LDPC code, into a plurality of sub blocks; and
   for each of a plurality of decoding iterations:
   performing a node operation of each of target sub blocks among the plurality of sub blocks, the target sub blocks corresponding to a present decoding iteration among the plurality of decoding iterations, in a decoding schedule;
   estimating a reliability of each of the target sub blocks, based on a result of the node operation of each of the target sub blocks; and
   adjusting the decoding schedule, based on the reliability of each of the target sub blocks,
   wherein the adjusting the decoding schedule comprises omitting, when the reliability of one of the target sub blocks is estimated to be higher than a reference value in the present decoding iteration, the node operation of the one of the target sub blocks in a next decoding iteration after the present decoding iteration.

2. The method of claim 1, wherein the reliability of each of the target sub blocks is estimated based on a log likelihood ratio (LLR) of a decoding message of each of the target sub blocks or an error bit number of each of the target sub blocks, as the result of the node operation of each of the target sub blocks.

3. The method of claim 1, wherein the estimating the reliability comprises:
   comparing the result of the node operation of each of the target sub blocks with the reference value; and
   determining the reliability of each of the target sub blocks, based on the comparing.

4. The method of claim 1, wherein the adjusting the decoding schedule comprises:
   when the reliability of one of the target sub blocks is estimated to be lower than the reference value in a K-th decoding iteration, where K is a natural number, adjusting the decoding schedule such that the node operation of the one of the target sub blocks is performed in a (K+1)-th decoding iteration; and
   when the reliability of the one of the target sub blocks is estimated to be higher than the reference value in the K-th decoding iteration, adjusting the decoding schedule such that the node operation of the one of the target sub blocks is not performed in the (K+1)-th decoding iteration.

5. The method of claim 1, wherein the estimating the reliability comprises:
   comparing the result of the node operation of one of the target sub blocks with the reference value in a K-th decoding iteration, where K is a natural number;
   when the result of the node operation of the one of the target sub blocks is estimated to be lower than the reference value, determining the reliability of the one of the target sub blocks, as a first value; and
   when the result of the node operation of the one of the target sub blocks is estimated to be higher than the reference value, determining the reliability of the one of the target sub blocks, as a second value.

6. The method of claim 5, wherein the adjusting the decoding schedule comprises:
   when the reliability of the one of the target sub blocks is the first value, adjusting the decoding schedule such that the node operation of the one of the target sub blocks is performed in a (K+1)-th decoding iteration; and
   when the reliability of the one of the target sub blocks is the second value, adjusting the decoding schedule such that the node operation of the one of the target sub blocks is not performed in the (K+1)-th decoding iteration but performed in a (K+2)-th decoding iteration.

7. The method of claim 1, wherein the estimating the reliability comprises:
   comparing the result of the node operation of one of the target sub blocks with each of a first reference value and a second reference value in a K-th decoding iteration, where K is a natural number;
   when the result of the node operation of the one of the target sub blocks is estimated to be lower than the first reference value, determining the reliability of the one of the target sub blocks, as a first reliability value;

when the result of the node operation of the one of the target sub blocks is estimated to be lower than the second reference value and higher than the first reference value, determining the reliability of the one of the target sub blocks, as a second reliability value; and when the result of the node operation of the one of the target sub blocks is estimated to be higher than the second reference value, determining the reliability of the one of the target sub blocks, as a third reliability value.

8. The method of claim 7, wherein the adjusting the decoding schedule comprises:

when the reliability of the one of the target sub blocks is the first reliability value, adjusting the decoding schedule such that the node operation of the one of the target sub blocks is performed in a (K+1)-th decoding iteration;

when the reliability of the one of the target sub blocks is the second reliability value, adjusting the decoding schedule such that the node operation of the one of the target sub blocks is not performed in the (K+1)-th decoding iteration but performed in a (K+2)-th decoding iteration; and when the reliability of the one of the target sub blocks is the third reliability value, adjusting the decoding schedule such that the node operation of the one of the target sub blocks is not performed in the (K+1)-th decoding iteration and the (K+2)-th decoding iteration but performed in a (K+3)-th decoding iteration.

9. The method of claim 1, wherein the performing the node operation comprises determining a decoding message of each of the target sub blocks, and wherein estimating the reliability comprises:

determining posteriori probabilities of codeword bits of each of the target sub blocks, based on the decoding message of each of the target sub blocks;

comparing the posteriori probabilities of each of the target sub blocks with the reference value; and determining the reliability of each of the target sub blocks, based on the comparing.

10. The method of claim 9, wherein the determining the reliability comprises:

when any one or any combination of the posteriori probabilities of one of the target sub blocks is lower than the reference value, determining the reliability of the one of the target sub blocks, as a first value lower than a threshold value; and when all of the posteriori probabilities of one of the target sub blocks are higher than the reference value, determining the reliability of the one of the target sub blocks, as a second value higher than the threshold value.

11. The method of claim 1, wherein the estimating the reliability comprises:

determining an error bit number of each of the target sub blocks, based on the node operation of each of the target sub blocks being performed;

comparing the error bit number of each of the target sub blocks with the reference value; and determining the reliability of each of the target sub blocks, based on the comparing.

12. The method of claim 11, wherein the determining the reliability comprises:

when the error bit number of one of the target sub blocks is larger than the reference value, determining the reliability of the one of the target sub blocks, as a first value lower than a threshold value; and when the error bit number of one of the target sub blocks is smaller than the reference value, determining the reliability of the one of the target sub blocks, as a second value higher than the threshold value.

13. The method of claim 1, wherein the adjusting the decoding schedule comprises:

providing a scheduling table indicating a mapping relation between each of the plurality of sub blocks and a corresponding decoding iteration in which the node operation of a respective one of the plurality of sub blocks is performed; and updating the mapping relation for subsequent decoding iterations, based on the reliability of each of the target sub blocks.

14. The method of claim 13, wherein the updating the mapping relation comprises:

when the reliability of one of the target sub blocks is estimated to be lower than the reference value in a K-th decoding iteration, where K is a natural number, mapping the one of the target sub blocks to a (K+1)-th decoding iteration; and when the reliability of the one of the target sub blocks is estimated to be higher than the reference value in the K-th decoding iteration, mapping the one of the target sub blocks to a (K+2)-th decoding iteration after the (K+1)-th decoding iteration.

15. A low density parity check (LDPC) decoder that divides a parity check matrix of an LDPC code, into a plurality of sub blocks and performs a decoding operation for each of a plurality of decoding iterations, the LDPC decoder comprising:

a variable node processor and a check node processor configured to perform a node operation of each of target sub blocks among the plurality of sub blocks, the target sub blocks corresponding to a present decoding iteration among the plurality of decoding iterations, in a decoding schedule;

a first processor implementing a reliability estimator configured to estimate a reliability of each of the target sub blocks, based on a result of the node operation of each of the target sub blocks; and a second processor implementing an update manager configured to adjust the decoding schedule, based on the reliability of each of the target sub blocks.

16. The LDPC decoder of claim 15, wherein the update manager comprises a scheduling table indicating a mapping relation between each of the plurality of sub blocks and a corresponding decoding iteration in which the node operation of a respective one of the plurality of sub blocks is performed, and wherein the update manager is further configured to update the mapping relation for subsequent decoding iterations, based on the reliability of each of the target sub blocks.

17. The LDPC decoder of claim 15, wherein the update manager is further configured to omit, when the reliability of one of the target sub blocks is estimated to be higher than a reference value in the present decoding iteration, the node operation of the one of the target sub blocks in a next decoding iteration after the present decoding iteration.

18. The LDPC decoder of claim 15, wherein the reliability estimator is further configured to:

compare the result of the node operation of each of the target sub blocks with a reference value; and generate a reliability signal having the reliability of each of the target sub blocks, based on the comparing.

19. A memory system comprising:
a memory device comprising a plurality of memory cells;
a memory controller configured to control an operation of the memory device; and
a low density parity check (LDPC) decoder configured to:
 divide a parity check matrix of an LDPC code that is read from the memory cells, into a plurality of sub blocks; and
 perform a decoding operation for each of a plurality of decoding iterations, wherein the LDPC decoder comprises:
 a variable node processor and a check node processor configured to perform a node operation of each of target sub blocks among the plurality of sub blocks, the target sub blocks corresponding to a present decoding iteration among the plurality of decoding iterations, in a decoding schedule;
 a first processor implementing a reliability estimator configured to estimate a reliability of each of the target sub blocks, based on a result of the node operation of each of the target sub blocks; and
 a second processor implementing an update manager configured to adjust the decoding schedule, based on the reliability of each of the target sub blocks.

* * * * *